United States Patent [19]

Yamamoto et al.

[11] Patent Number: 5,212,043

[45] Date of Patent: May 18, 1993

[54] PHOTORESIST COMPOSITION COMPRISING A NON-AROMATIC RESIN HAVING NO AROMATIC STRUCTURES DERIVED FROM UNITS OF AN ALIPHATIC CYCLIC HYDROCARBON AND UNITS OF MALEIC ANHYDRIDE AND/OR MALEIMIDE AND A PHOTOSENSITIVE AGENT

[75] Inventors: Takashi Yamamoto, Ebina; Masaaki Todoko, Fujisawa; Toru Seita; Kyoko Nagaoka, both of Atsugi; Kosaburo Matsumura, Yokohama, all of Japan

[73] Assignee: Tosho Corporation, Japan

[21] Appl. No.: 425,191

[22] PCT Filed: Feb. 17, 1989

[86] PCT No.: PCT/JP89/00159

§ 371 Date: Oct. 17, 1989

§ 102(e) Date: Oct. 17, 1989

[30] Foreign Application Priority Data

| Feb. 17, 1988 | [JP] | Japan | 63-32806 |
| Feb. 18, 1988 | [JP] | Japan | 63-33877 |
| Feb. 18, 1988 | [JP] | Japan | 63-33878 |
| Feb. 18, 1988 | [JP] | Japan | 63-33879 |
| Feb. 18, 1988 | [JP] | Japan | 63-33880 |
| Feb. 25, 1988 | [JP] | Japan | 63-40647 |
| May 23, 1988 | [JP] | Japan | 63-123925 |
| May 23, 1988 | [JP] | Japan | 63-123926 |
| Jul. 4, 1988 | [JP] | Japan | 63-165124 |
| Jul. 4, 1988 | [JP] | Japan | 63-165125 |
| Jul. 4, 1988 | [JP] | Japan | 63-165126 |
| Jul. 4, 1988 | [JP] | Japan | 63-165128 |

[51] Int. Cl.$^5$ .................. G03F 7/023; G03F 7/012; C08F 36/00
[52] U.S. Cl. .................. 430/192; 430/165; 430/193; 430/197; 430/325; 430/326; 430/907; 430/910; 526/280; 526/283; 526/308; 526/309
[58] Field of Search ............... 430/192, 193, 197, 907, 430/910, 165, 325, 326; 526/280, 283, 308, 309

[56] References Cited

U.S. PATENT DOCUMENTS

| 3,188,303 | 6/1965 | Dissen | 526/283 |
| 3,984,381 | 10/1976 | Tsuchiya et al. | 526/283 |
| 4,106,943 | 8/1978 | Ikeda et al. | 96/115 R |
| 4,126,738 | 11/1978 | Gaylord | 526/271 |
| 4,217,407 | 8/1980 | Watanabe et al. | 430/192 |
| 4,309,519 | 1/1982 | Ohara et al. | 526/283 |
| 4,407,926 | 10/1983 | Stahlhofer | 430/192 |
| 4,454,521 | 6/1984 | Suguro et al. | 430/176 |
| 4,525,523 | 6/1985 | Nakamura et al. | 524/572 |
| 4,643,963 | 2/1987 | Hartmann et al. | 430/288 |
| 4,663,268 | 5/1987 | Turner et al. | 430/192 |
| 4,720,445 | 1/1988 | Brahim et al. | 430/192 |
| 4,880,873 | 11/1989 | Sagane | 526/326 |
| 4,935,330 | 6/1990 | Hofmann et al. | 430/281 |
| 4,980,264 | 12/1990 | Chiong et al. | 430/197 |
| 5,059,513 | 10/1991 | Hapf et al. | 430/192 |
| 5,081,000 | 1/1992 | Kuehn et al. | 430/910 |

FOREIGN PATENT DOCUMENTS

| 0099949 | 2/1984 | European Pat. Off. . |
| 0140319 | 5/1985 | European Pat. Off. . |
| 2477294 | 9/1981 | France . |
| 59-170836 | 9/1984 | Japan . |
| 1243963 | 8/1971 | United Kingdom . |

Primary Examiner—Charles L. Bowers, Jr.
Assistant Examiner—John S. Chu
Attorney, Agent, or Firm—Oblon, Spivak, McClelland, Maier & Neustadt

[57] ABSTRACT

A photoresist composition comprising:
a resin soluble in an aqueous alkaline solution, having units of an aliphatic cyclic hydrocarbon main frame and units derived from maleic anhydride and/or units derived from a maleimide; and
a photosensitive agent in a sufficient amount to promote or hinder the solubility of said resin in an aqueous alkaline solution upon exposure to active radiation so as to create a substantial difference in the solubility as between an exposed portion and a non-exposed portion and to form a positive or negative image by subsequent development with an aqueous alkaline solution.

19 Claims, No Drawings

PHOTORESIST COMPOSITION COMPRISING A NON-AROMATIC RESIN HAVING NO AROMATIC STRUCTURES DERIVED FROM UNITS OF AN ALIPHATIC CYCLIC HYDROCARBON AND UNITS OF MALEIC ANHYDRIDE AND/OR MALEIMIDE AND A PHOTOSENSITIVE AGENT

The present invention relates to a photoresist composition. More particularly, the present invention relates to a photoresist composition suitable for far ultraviolet or excimer laser lithography, wherein a resin soluble in an aqueous alkaline solution having units of an aliphatic cyclic hydrocarbon main frame and units derived from maleic anhydride and/or units derived from a maleimide, is used as a base resin. Such a composition is useful particularly as a resist for fine working in the field for the production of semiconductor elements.

With respect to semiconductor elements such as LSI or VLSI, the degree of their working tends to be finer year by year for the purpose of improving their performance. At present, lithography using g-line (436 nm) as the light source is widely used as a fine working technique for the production of such semiconductor elements. Even in such lithography, efforts for a higher resolution are being made to meet the need for fine working of such elements. As the main techniques presently available for a high resolution, there may be mentioned an attempt for a higher NA (numerical aperture) of a lens for reduced projection in an exposure apparatus and an attempt for a shorter wavelength of the light source for exposure from g-line to i-line (365 nm). Among them, the attempt for a higher NA of lens has already reached a level close to the limit. For the future, it will be necessary to further the attempt for a shorter wavelength of the light source for exposure and thereby to accomplish a higher resolution for lithography. With such a background, the resist will also be required to meet the requirements for a short wave light source such as far ultraviolet rays or excimer laser. Now, the applicability and problems of resists for application to lithography using such a short wave light source, will be described.

A resist is usually a composition comprising a base resin, a photosensitive agent and a solvent. Among them, as the base resin, a resin soluble in an aqueous alkaline solution is commonly employed for a resist required to have a high resolution so that both positive and negative resists can be developed with an aqueous alkaline solution to avoid a problem of swelling during the development. As such a resin soluble in an aqueous alkaline solution, a phenol resin such as a novolak resin or a polyvinylphenol is most commonly used at present. Such a phenol resin is relatively transparent in the wavelength region of g-line or i-line. However, in the wavelength region of far ultraviolet or excimer laser, such a phenol resin tends to be extremely poor in transparency, since it has aromatic rings in its structure. Therefore, if a conventional photoresist composition using a phenol resin as the base resin, is used for lithography using a short wavelength light as the light source, the incident light entered from above the resist can not reach the bottom of the resist layer, whereby the resist reaction can not uniformly be conducted in the direction perpendicular to the resist layer. As a result, with a positive resist, the development tends to be inadequate or the resist pattern tends to be trapezoid if the development is strongly conducted. On the other hand, with a negative resist, the pattern after the development tends to be reversed-trapezoid. If the wall of the resist is not vertical, the width of the resist pattern is likely to be changed in the subsequent step for etching a part of the resist (such as reactive ion etching), whereby an adverse effect is likely to be given to the circuit thereby produced. Further, with either type of resist, in order to let the light reach the bottom of the resist layer, a large quantity of exposure is required. Consequently, such a resist is not necessarily satisfactory with respect to the sensitivity.

It is an object of the present invention to provide a photoresist composition which is capable of providing excellent transparency in the wavelength regions of far ultraviolet rays and excimer laser and which has a high resolution and high sensitivity.

Under these circumstances, the present inventors have conducted extensive researches, and as a result, have found that a resin having units of an aliphatic cyclic hydrocarbon main frame and units derived from maleic anhydride and/or units derived from a maleimide has both solubility in an aqueous alkaine solution and transparency to a short wavelength light such as far ultraviolet or excimer laser, and that a composition comprising such a resin and a photosensitive agent can be a photoresist composition satisfying the above object. The present invention has been accomplished on the basis of these discoveries.

The present invention provides a photoresist composition comprising:

a resin soluble in an aqueous alkaline solution, having units of an aliphatic cyclic hydrocarbon main frame and units derived from maleic anhydride and/or units derived from a maleimide; and a photosensitive agent in a sufficient amount to promote or hinder the solubility of said resin in an aqueous alkaline solution upon exposure to active radiation so as to create a substantial difference in the solubility as between an exposed portion and a non-exposed portion and to form a positive or negative image by subsequent development with an aqueous alkaline solution.

Now, the present invention will be described in detail with reference to the preferred embodiments.

The resin soluble in an aqueous alkaline solution having units of an aliphatic cyclic hydrocarbon main frame and units derived from maleic anhydride and/or units derived from a maleimide, to be used for the photoresist composition of the present invention, is a copolymer of an aliphatic cyclic hydrocarbon having at least one unsaturated double bond with maleic anhydride or a maleimide, or a resin obtained by hydrolyzing acid anhydride rings in maleic anhydride units of the above-mentioned copolymer of an aliphatic cyclic hydrocarbon with maleic anhydride, or by ring-opening such acid anhydride rings by a compound having a hydroxyl group or by a compound having an amino group, or a resin obtained by ring-opening acid anhydride rings in maleic anhydride units of the above-mentioned copolymer of an aliphatic cyclic hydrocarbon with maleic anhydride, by a compound having an amino group, followed by imido-ring closure of a part or whole of the maleamic acid units formed by the ring opening.

Firstly, the above-mentioned copolymer of an aliphatic cyclic hydrocarbon with maleic anhydride or a maleimide will be described.

The aliphatic cyclic hydrocarbon having at least one unsaturated double bond useful for the synthesis of the resin includes compounds of the following formulas (1) to (8)

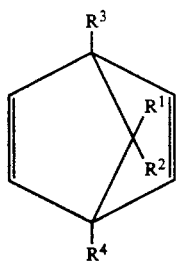

(1)

wherein each of $R^1$ to $R^4$ which may be the same or different, is a hydrogen atom or an alkyl group having from 1 to 3 carbon atoms.

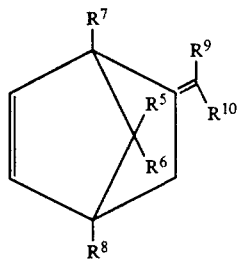

(2)

wherein each of $R^5$ to $R^{10}$ which may be the same or different, is a hydrogen atom or an alkyl group having from 1 to 3 carbon atoms.

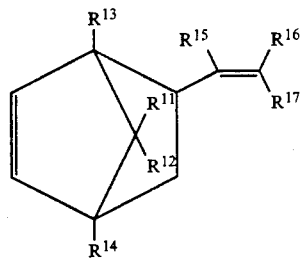

(3)

wherein each of $R^{11}$ to $R^{17}$ which may be the same or different, is a hydrogen atom or an alkyl group having from 1 to 3 carbon atoms.

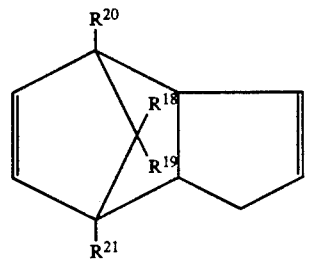

(4)

wherein each of $R^{18}$ to $R^{21}$ which may be the same or different, is a hydrogen atom or an alkyl group having from 1 to 3 carbon atoms.

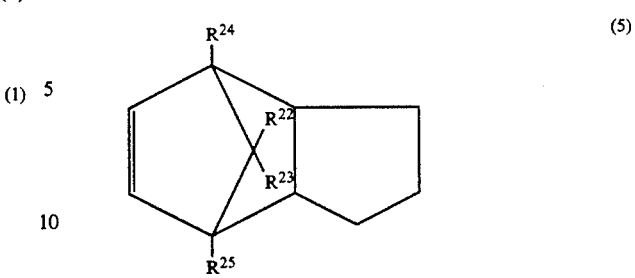

(5)

wherein each of $R^{22}$ to $R^{25}$ is a hydrogen atom or an alkyl group having from 1 to 3 carbon atoms.

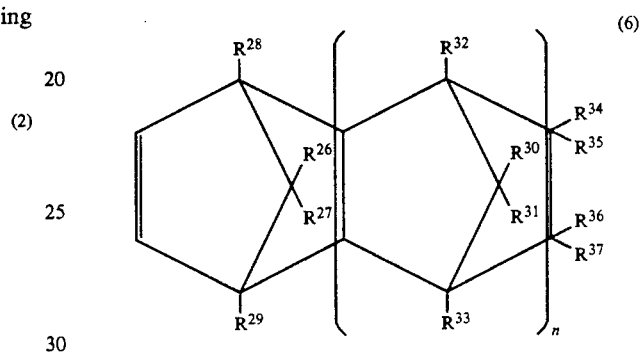

(6)

wherein each of $R^{26}$ to $R^{37}$ which may be the same or different, is a hydrogen atom or an alkyl group having from 1 to 3 carbon atoms, provided that $R^{34}$ or $R^{35}$ may together with $R^{36}$ or $R^{37}$ form a ring, n is an integer of 0 or at least 1, and when $R^{30}$ to $R^{33}$ are repeated, they may be the same or different.

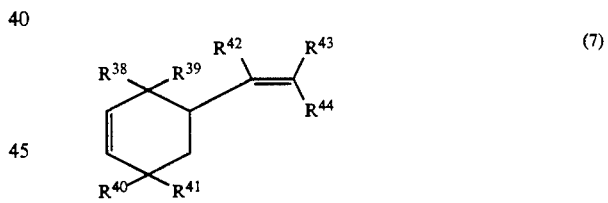

(7)

wherein each of $R^{38}$ to $R^{44}$ which may be the same or different, is a hydrogen atom or an alkyl group having from 1 to 3 carbon atoms.

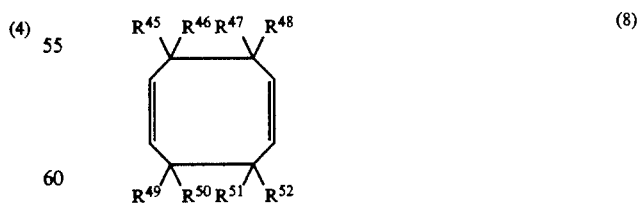

(8)

wherein each of $R^{45}$ to $R^{52}$ which may be the same or different, is a hydrogen atom or an alkyl group having from 1 to 3 carbon atoms.

Specific examples of the compound of the formula (1) include the following compounds:

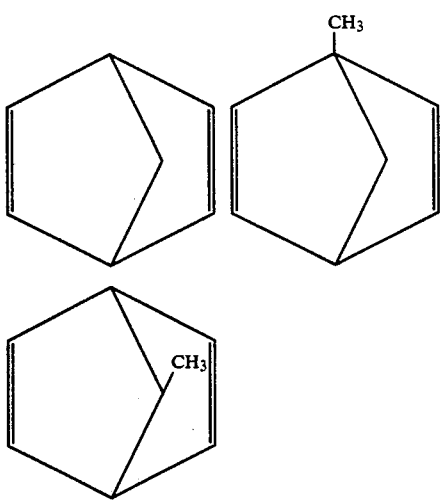

Specific examples of the compound of the formula (2) include the following compounds:

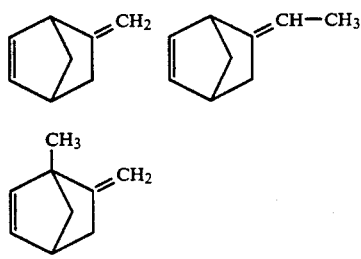

Specific examples of the compound of the formula (3) include the following compounds:

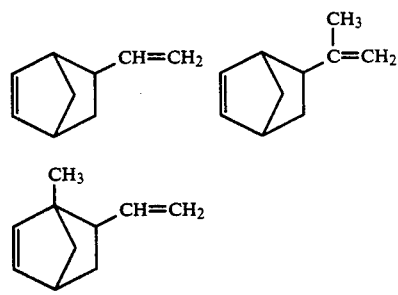

Specific examples of the compound of the formula (4) include the following compounds:

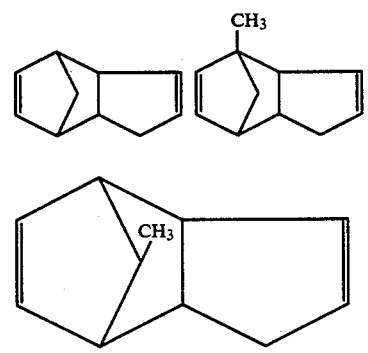

Specific examples of the compound of the formula (5) include the following compounds:

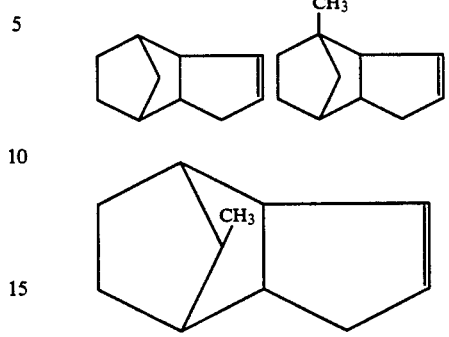

Specific examples of the compound of the formula (6) include the following compounds:

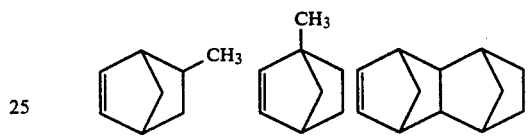

Specific examples of the compound of the formula (7) include the following compounds:

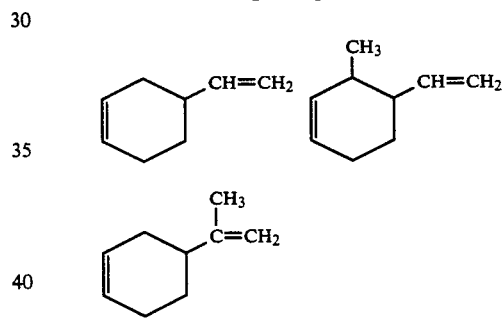

Specific examples of the compound of the formula (8) include the following compounds:

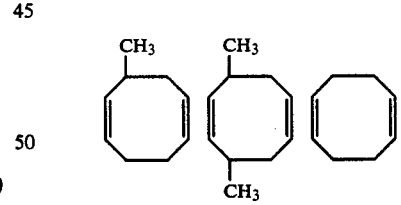

Copolymers of these aliphatic cyclic hydrocarbons with maleic anhydride or maleimides are formed usually as 1:1 alternating copolymers by e.g. radical copolymerization. These copolymers may be prepared by the processes disclosed, for example, by H. Pledger, Jr. et al in J. Macromol. Sci.—Chem., A5(3), pp491 (1971) and A5(8), pp1339 (1971), by Rostyslaw Doubenko et al in Polymer Letters, Vol. 2, pp469 (1964) or in U.S. Pat. Nos., 3,143,533, 3,261,815, 3,510,461 and 3,703,501 and U.K. Patents, 1,015,215 and 1,255,838.

Now, the resin obtained by hydrolyzing acid anhydride rings in maleic anhydride units of the above-mentioned copolymer of an aliphatic cyclic hydrocarbon having at least one unsaturated double bond, with maleic anhydride, or by ring-opening such acid anhydride rings by a compound having a hydroxyl group or by a compound having an amino group, will be described.

Such a resin is obtainable by using the above-mentioned copolymer of an aliphatic cyclic hydrocarbon having at least one unsaturated double bond, with maleic anhydride, as a starting material for the synthesis.

Here, the compound having a hydroxyl group is a compound of the formula (9):

HO—$R^{53}$ (9)

wherein $R^{53}$ is an alkyl group, a cycloalkyl group or a group of the formula (10), (11) or (12):

—$R^{54}$—OH (10)

$$-R^{55}-\overset{O}{\underset{\|}{C}}-O-R^{56}$$ (11)

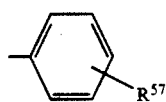 (12)

wherein each of $R^{54}$ and $R^{55}$ is an alkylene group, $R^{56}$ is a hydrogen atom, an alkyl group or a cycloalkyl group, and $R^{57}$ is a hydrogen atom, an alkyl group, a carboxyl group, an alkoxy group, a nitro group or an amino group.

Specifically, it includes methyl alcohol, ethyl alcohol, n-propyl alcohol, isopropyl alcohol, n-butyl alcohol, sec.-butyl alcohol, tert.-butyl alcohol, cyclopentyl alcohol, cyclohexyl alcohol, cycloheptyl alcohol, ethylene glycol, methyl glycolate, ethyl glycolate, and hydroxydicyclopentadiene.

The compound having an amino group is a compound of the formula (13):

$H_2N$—$R^{58}$ (13)

wherein $R^{58}$ is an alkyl group, a cycloalkyl group or a group of the formula (14), (15) or (16):

—$R^{59}$—OH (14)

$$-R^{60}-\overset{O}{\underset{\|}{C}}-O-R^{61}$$ (15)

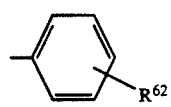 (16)

wherein each of $R^{59}$ and $R^{60}$ is an alkylene group, $R^{61}$ is a hydrogen atom, an alkyl group or a cycloalkyl group, and $R^{62}$ is a hydrogen atom, an alkyl group, a carboxyl group, an alkoxy group, a nitro group or an amino group.

Specifically, it includes n propylamine, isopropylamine, n-butylamine, tert.-butylamine, sec.-butylamine, isobutylamine, ethanolamine, 4 -aminobutyric acid, cyclohexylamine, cyclopentylamine, cycloheptylamine, 4-aminocyclohexanol, 2 amino-1-butanol, 2-aminonorbornane, 3-amino-1-propanol, 6-amino-1-hexanol and 12-aminododecanoic acid.

The hydrolysis of acid anhydride rings in the copolymer of the above-mentioned aliphatic cyclic hydrocarbon having at least one unsaturated double bond, with maleic anhydride, or the ring-opening of such acid anhydride rings by the compound of the formula (9) or (13), can be conducted by mixing the copolymer with water or with the compound of the formula (9) or (13), followed by the reaction at a temperature cf from 70° to 140° C. for from 2 to 24 hours, by using an inorgnaic alkali such as sodium hydroxide as a catalyst in the case of the hydrolysis, by using sulfuric acid as a catalyst in the case of the ring-opening of the acid anhydride rings by means of the compound of the formula (9), and without using any catalyst in the case of the ring-opening of the acid anhydride rings by means of the compound of the formula (13).

The ring-opening rate of the acid anhydride rings in the above ring-opening reaction can be calculated from the results of the elemental analysis by the IR analysis of the resin thus obtained. Namely, with respect to the resin ring-opened by the compound of the formula (13), the ring-opening rate was obtained directly from the quantitative analysis of the nitrogen atom in the resin by the elemental analysis. With respect to the resin obtained by the hydrolysis of by the ring opening by means of the compound of the formula (9), the ring-opening rate was indirectly obtained based on a calibration curve prepared on the basis of the interrelation between the peak intensities at 1,770 cm$^{-1}$ and 1,850 cm$^{-1}$ (absorptions attributable to C=O of an acid anhydride ring) in the IR analysis and the ratio of the units having acid anhydride rings to the total constituting units, from the results of the resin ring-opened by means of the compound of the formula (13).

Now, the resin obtained by ring-opening acid anhydride rings in maleic anhydride units of the copolymer of an aliphatic cyclic hydrocarbon having at least one unsaturated double bond, with maleic anhydride, by the above-mentioned compound having an amino group, followed by imido ring-closure of a part or whole of maleamic acid units formed by the ring-opening in the copolymer, will be described.

Such a resin is obtainable by using as a starting material the resin obtained by ring-opening acid anhydride rings in maleic anhydride units of the copolymer of an aliphatic cyclic hydrocarbon having at least one unsaturated double bond, with maleic anhydride, by the compound of the formula (13). The imido ring-closure of such a resin may be carried out, for example, by reacting it in an organic solvent having a high boiling point such as DMF in the presence of a tertiary amine such as tri n-butylamine as a catalyst at a temperature of from 120° to 180° C. for from 2 to 8 hours. From the viewpoint of the solubility in an aqueous alkaline solution, it is preferred that either one or both of the units having acid anhydride rings and the maleamic acid units remain in an amount of at least 10% based on the total constituting units in the resin thus obtained by the imido ring-closure of the above-mentioned resin. For this purpose, if the imido ring-closure is conducted completely, it is necessary to employ as the starting material a resin containing at least 10% of the units having acid anhydride rings. If a resin containing less than 10% of the units having acid anhydride rings, based on the total constituting units, is used as the starting material, it is necessary to control the reaction condition so that the sum of the units having acid anhydride rings and the maleamic acid units in the resin resulting from the imido ring-closure will be not less than 10%. This can be done, for example, by lowering the reaction temperature or by shortening the reaction time.

However, this does not apply to a case where the starting material is a resin obtained by ring-opening acid anhydride rings of maleic anhydride units of the copolymer of an aliphatic cyclic hydrocarbon having at least one unsaturated double bond, with maleic anhydride, by the compound of the formula (13), wherein the compound of the formula (13) is one of the following compounds:

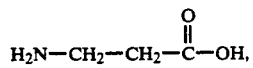

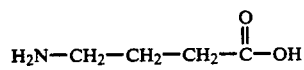

Now, the resin soluble in an aqueous alkaline solution to be used for the photoresist composition of the present invention thus obtained, will be described in further detail with reference to specific examples. Among the above resins soluble in an aqueous alkaline solution, the copolymer of an aliphatic cyclic hydrocarbon having at least one unsaturated double bond, with maleic anhydride, is a resin having, for instance, the following repeating units:

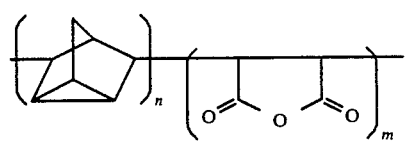
No. 1

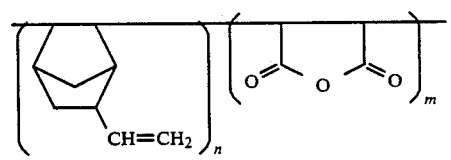
No. 2

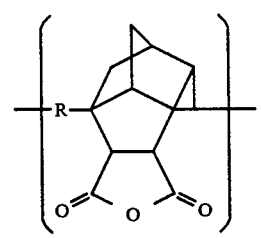
No. 3

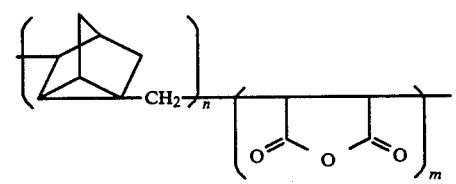
No. 4

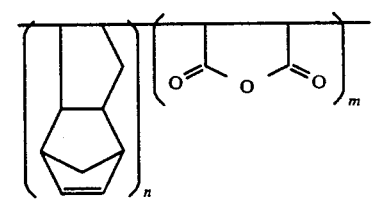
No. 5

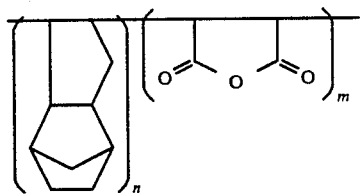
No. 6

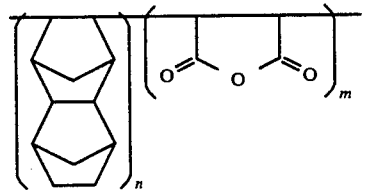
No. 7

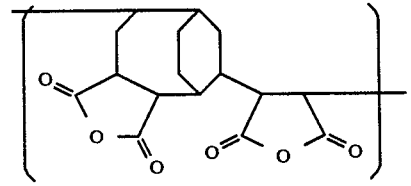
No. 8

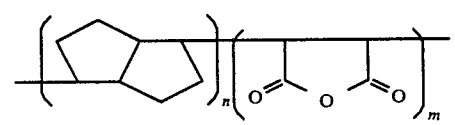
No. 9

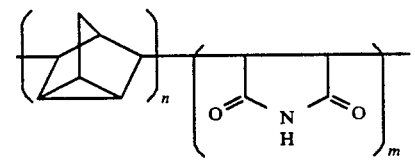
No. 10

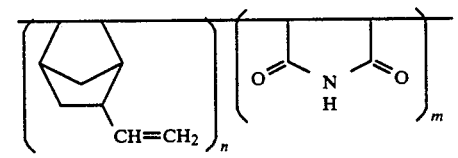
No. 11

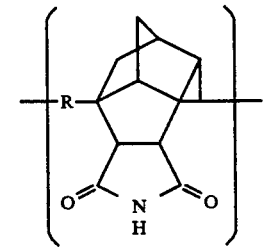
No. 12

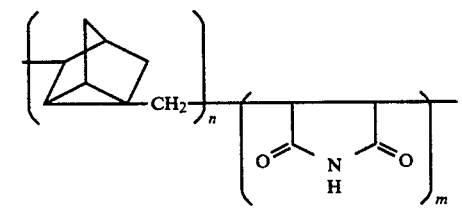
No. 13

No. 14

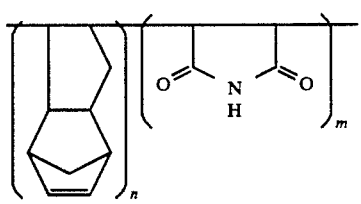

No. 15

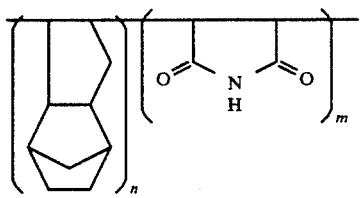

No. 16

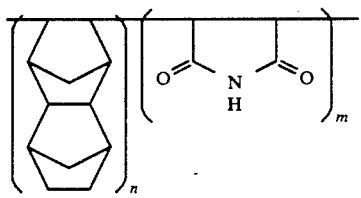

No. 17

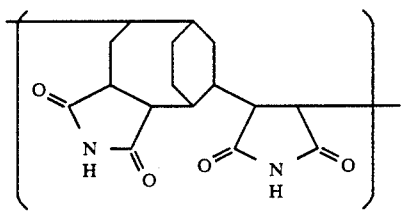

No. 18

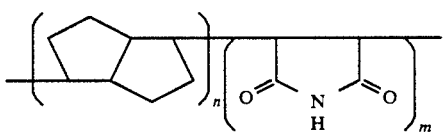

The resin obtained by hydrolyzing acid anhydride rings in maleic anhydride units of the copolymer of an aliphatic cyclic hydrocarbon having at least one unsaturated double bond, with maleic anhydride, is a resin containing, for example, the following repeating units:

No. 19

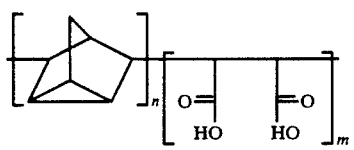

No. 20

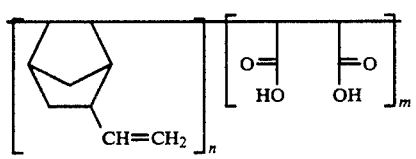

No. 21

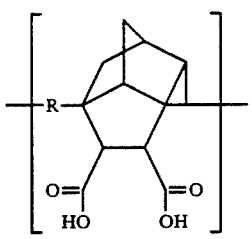

No. 22

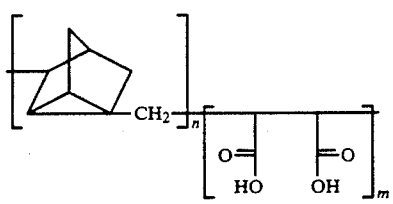

No. 23

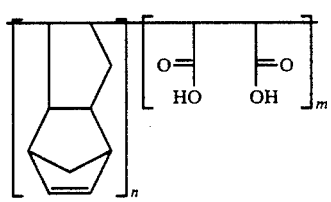

No. 24

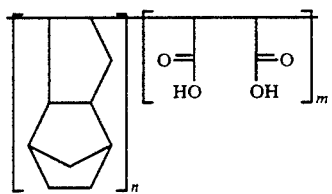

No. 25

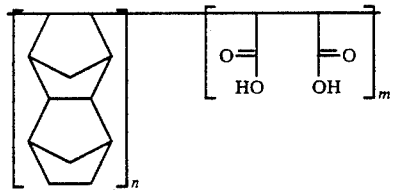

No. 26

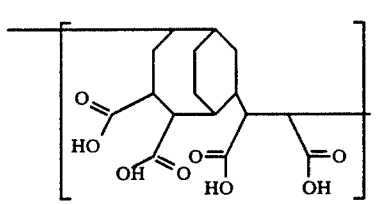

No. 27

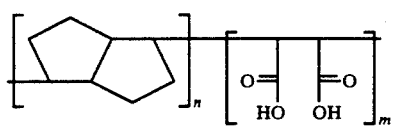

The resin obtained by ring-opening acid anhydride rings in maleic anhydride units of the copolymer of an aliphatic cyclic hydrocarbon having at least one unsaturated double bond, with maleic anhydride, by the compound having a hydroxyl group, is a resin having, for example, the following repeating units:

No. 28
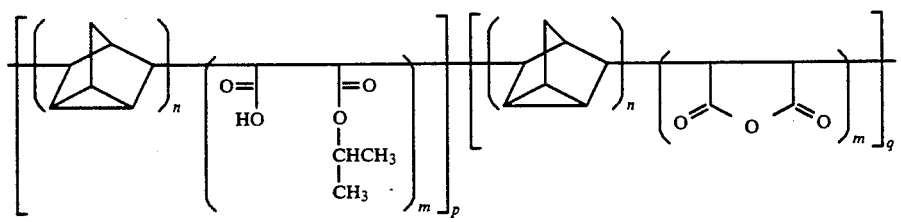
No. 29
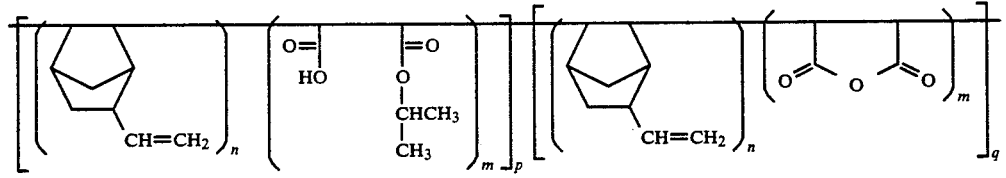
No. 30
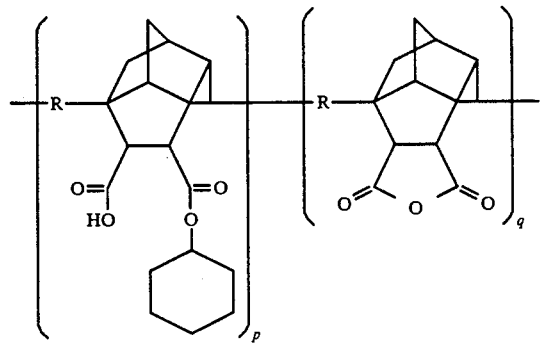
No. 31
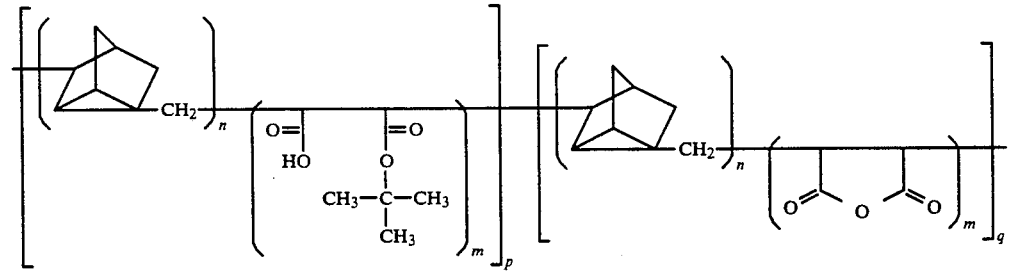
No. 32
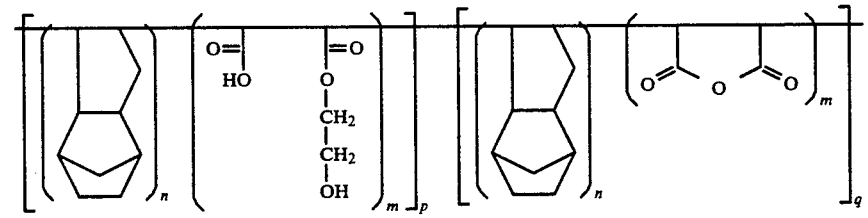
No. 33
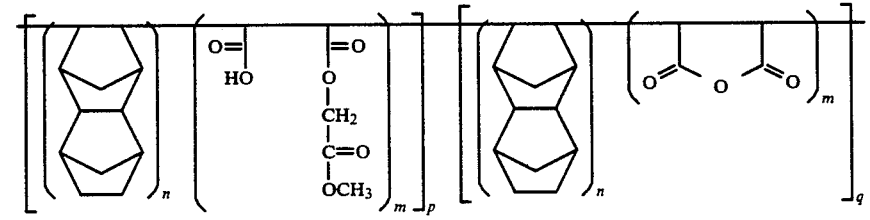

No. 34
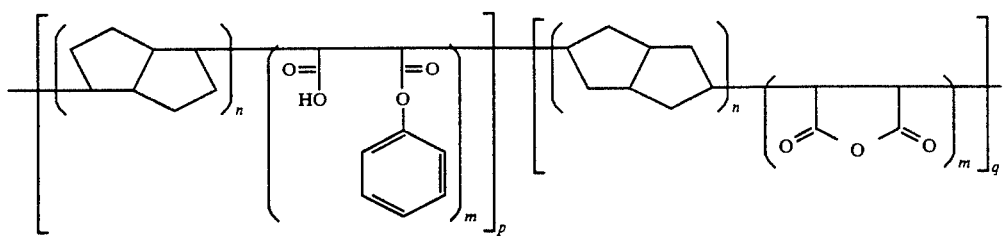
The resin obtained by ring-opening acid anhydride rings in maleic anhydride units of the copolymer of an aliphatic cyclic hydrocarbon having at least one unsaturated double bond, with maleic anhydride, by the compound having an amino group, is a resin having, for example, the following repeating units:
No. 35
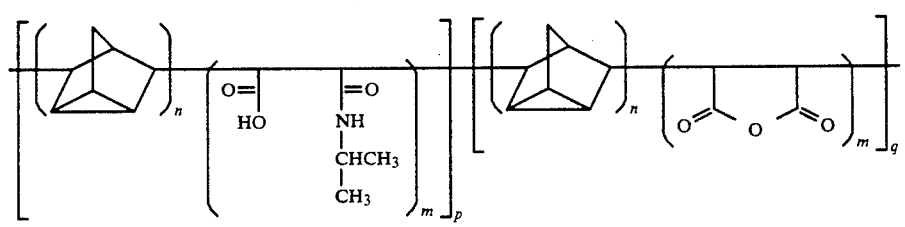
No. 36
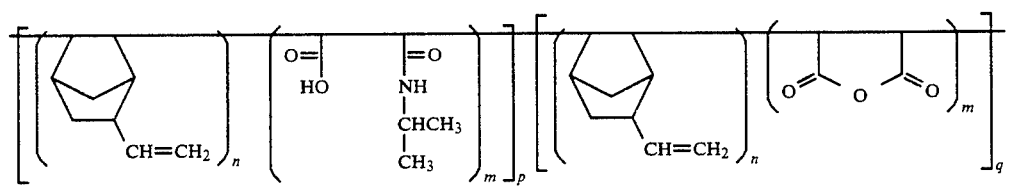
No. 37
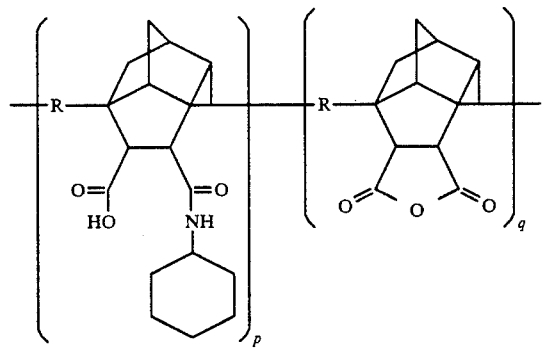
No. 38
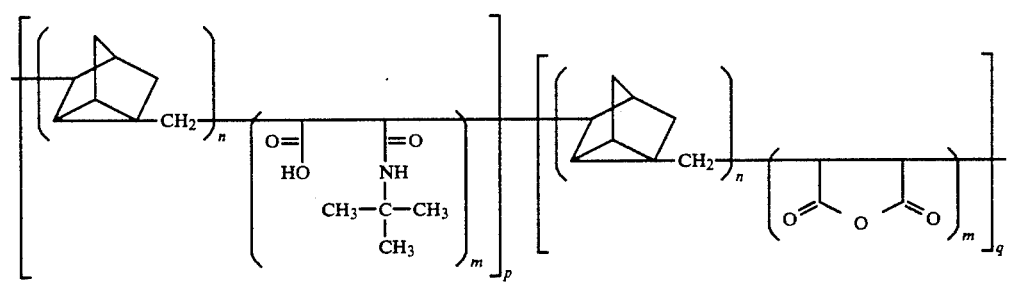
No. 39
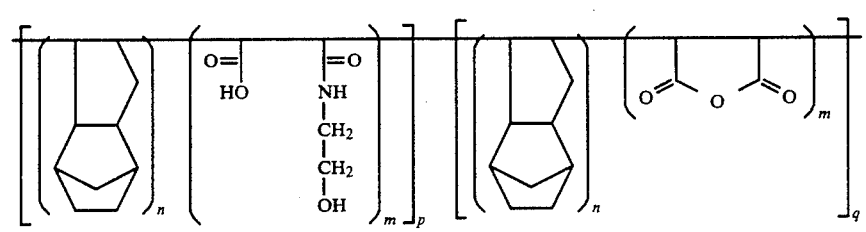

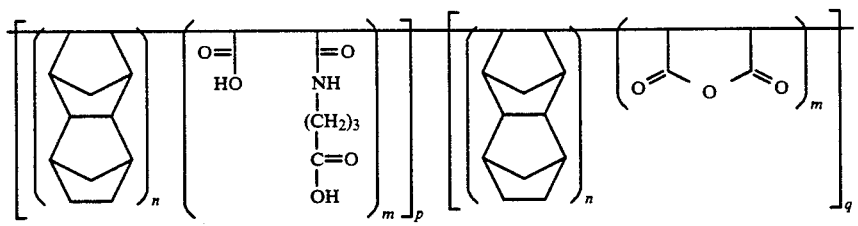

No. 40

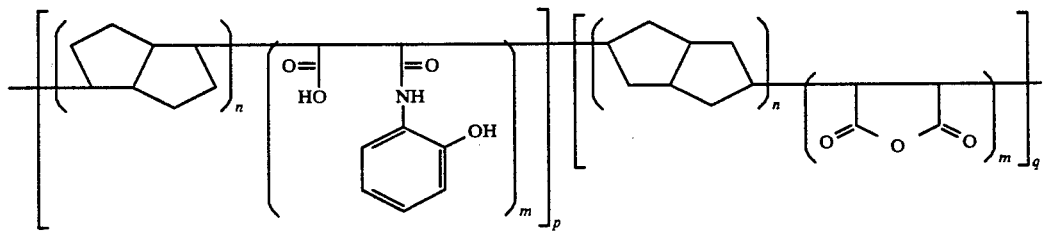

No. 41

The resin obtained by ring-opening acid anhydride rings in maleic anhydride units of the copolymer of an aliphatic cyclic hydrocarbon having at least one unsaturated double bond, with maleic anhydride, by the compound having an amino group, followed by the imido ring-closure of a part or whole of maleamic acid units formed by the ring-opening in the above copolymer, is a resin having, for example, the following repeating units:

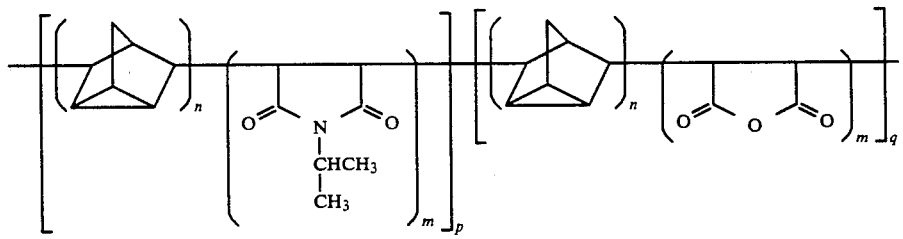

No. 42

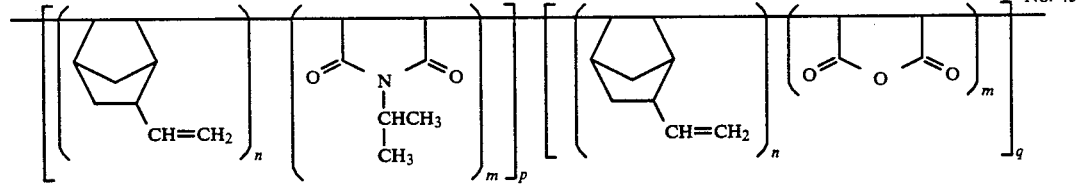

No. 43

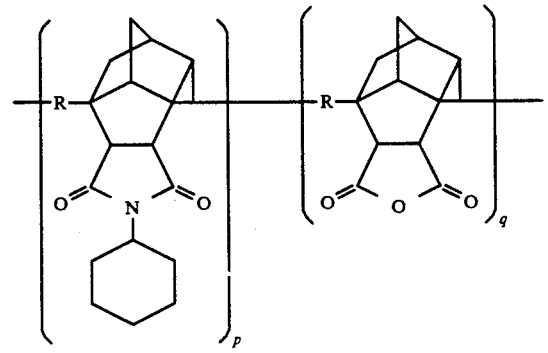

No. 44

-continued

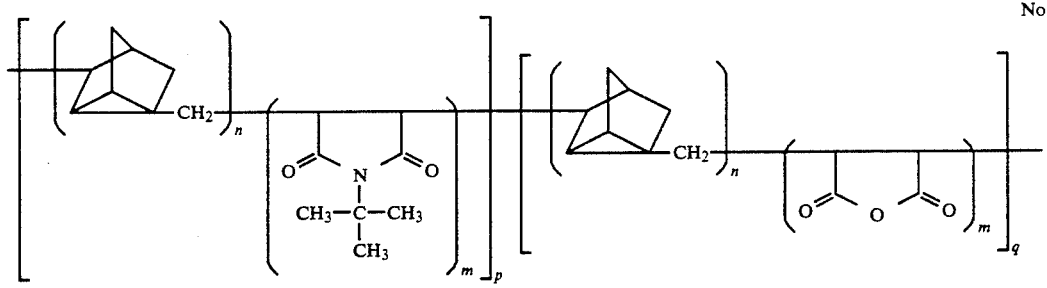
No. 45

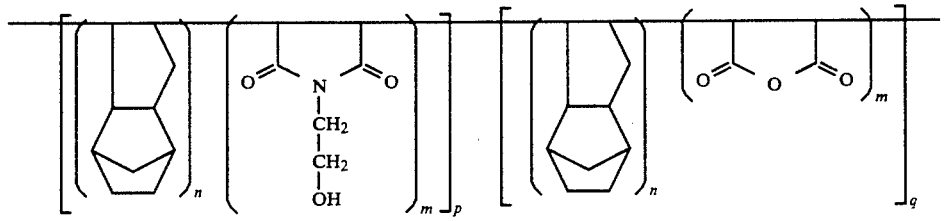
No. 46

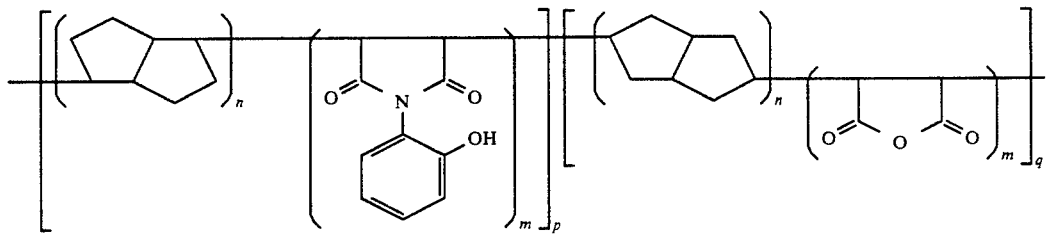
No. 47

In the above formulas, R is an alkylene group having from 1 to 3 carbon atoms, which may have a side chain, n and m are positive numbers which satisfy n/(n+m) being from 0.1 to 0.9, preferably from 0.3 to 0.7, and p and q are positive numbers, the sum of which is 1.

The resin soluble in an aqueous alkaline solution is a resin having a weight average molecular weight (Mw) of from 1,000 to 20,000, preferably from 2,000 to 15,000, as measured by gel permeation chromatography using monodisperse polystyrene as the standard. If the molecular weight is outside the above range, there will be adverse effects to the sensitivity, the resolution, the heat resistance, the coating film properties or the adhesion to the substrate.

Now, the photosensitive agent to be used for the photoresist composition of the present invention will be described in detail.

As the photosensitive agent to be used for the photoresist composition of the present invention, may be any photosensitive agent so long as it is capable of hindering or promoting the solubility of the resin in an aqueous alkaline solution, when incorporated in such a resin and irradiated with active radiation, particularly with ultraviolet rays or excimer laser so as to create a substantial difference in the solubility as between an exposed portion and a non-exposed portion (i.e. creation of a latent image) and to form a positive or negative image by subsequent development with an aqueous alkaline solution. However, as a positive photosensitive agent, a naphthoquinone diazide sulfonate type photosensitive agent is preferred. Likewise, as a negative photosensitive agent, a bisazide type photosensitive agent is preferred.

Naphthoquinone diazide sulfonate photosensitive agents are commonly known. For example, compounds disclosed in U.S. Pat. Nos. 2,766,118, 2,767,09, 2,772,972, 2,859,112, 2,907,665, 3,946,110, 3,046,111, 3,046,115, 3,046,118, 3,046,119, 3,046,120, 3,046,121, 3,046,122, 3,046,123, 3,061,430, 3,102,809, 3,106,465, 3,635,709 and 3,647,443, may be employed as photosensitive agents useful for the photoresist composition of the present invention. Specifically, the following compounds may be mentioned.

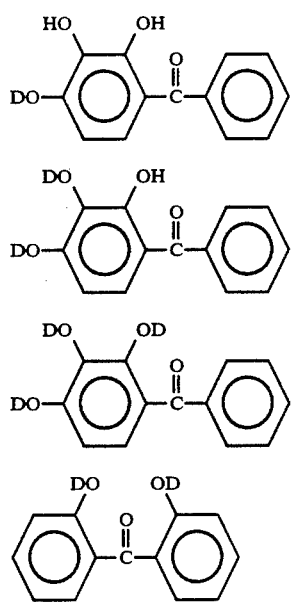

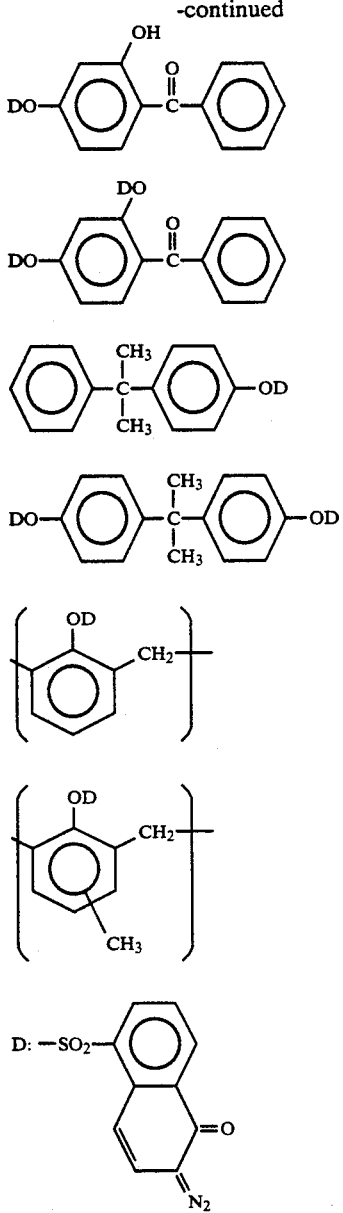

As bisazide type photosensitive agents, bisazide compounds disclosed in e.g. Japanese Unexamined Patent Publications Nc. 167351/1988 and Nc. 191142/1988, may be employed as photosensitive agents useful for the photoresist compositions of the present invention. Specifically, 3,3'-diazidobenzophenone, 3,3'-diazidodiphenylsulfone, 4,4'-diazidodiphenylsulfide, 3,3'-dimethoxy-4,4'-diazidobiphenyl and 2,7-diazidofluorene may be mentioned.

As other examples of the positive photosensitive agents preferably employed for the photoresist compositions of the present invention, 2-diazo-1,3-dione compounds disclosed in e.g. Japanese Examined Patent Publications No. 47296/1987 and No. 47297/1987 and Japanese Unexamined Patent Publications No. 14235/1985, No. 22387/1986, No. 163340/1988 and No. 170639/1988, may be mentioned.

These positive or negative photosensitive agents may respectively be used alone or in combination as a mixture of two or more.

With respect to the proportions of the resin soluble in an aqueous alkaline solution and the photosensitive agent, the photosensitive agent is used in an amount of from 1 to 100 parts by weight, preferably from 10 to 70 parts by weight, per 100 parts by weight of the resin soluble in an aqueous alkaline solution. If the amount is outside the above range, there will be adverse effects to the sensitivity of the resist, the difference in the solubility between the exposed portion and the non-exposed portion, the pattern precision and the properties of the coating film.

The photoresist composition of the present invention is soluble in an organic solvent. When it is used for the preparation of integrated circuits, it is employed usually in the form of a solution (a resist solution). In such a case, the above composition is dissolved usually in an amount of from 1 to 50% by weight, preferably from 5 to 30% by weight, in an organic solvent and adjusted. As the solvent to be used for this purpose is preferably the one which is capable of uniformly dissolving the respective components of the positive photoresist composition of the present invention and capable of providing a uniform smooth coating layer when the solution is applied to the surface of a substrate such as silicon or aluminum, followed by evaporation of the organic solvent. Specifically, it includes a ketone solvent such as acetone, methyl ethyl ketone, cyclopentanone or cyclohexanone, a cellosolve solvent such as methyl cellosolve, ethyl cellosolve, butyl cellosolve, methyl cellosolve acetate or ethyl cellosolve acetate, an ether solvent such as tetrahydrofuran or diethylene glycol dimethyl ether, and an ester solvent such as ethyl acetate or butyl acetate. However, the solvent is not limited to such specific examples.

The above organic solvents may be used alone or in combination as a mixture of two or more.

In addition to the above components, plasticizers, sensitizers, dyes, other resins, inhibitors such as thermal reaction inhibitors and adhesion promotors, may be added to the photoresist compositions of the present invention, as the case requires.

As mentioned above, the positive photoresist composition of the present invention may be prepared into a resist solution, and a relief pattern may be formed with it by means of lithography technique.

Now, the method of forming such a relief pattern will be described.

Firstly, the resist solution prepared as described above, is coated to a substrate. The coating to the substrate may be conducted by e.g. a spinner. Then, the coated solution is subjected to baking at a temperature of from 60° to 120° C., preferably from 80° to 100° C., for from 20 to 60 minutes. After baking, far ultraviolet rays or excimer laser is irradiated to this coating film through a photomask chart. Middle ultraviolet rays may also be employed.

Then, the exposed portions will be washed away with a developing solution to obtain a relief pattern. As the developing solution, a weakly alkaline aqueous solution having a concentration of e.g. not higher than 5% by weight of e.g. sodium hydroxide, potassium hydroxide, sodium metasilicate of tetramethylammonium hydroxide, may be employed. The relief pattern thus formed is excellent in the sharpness and contrast.

Further, by using the pattern formed by using the photoresist composition of the present invention as described above, as a mask, it is possible to conduct etching of a substrate.

The photoresist composition of the present invention exhibits a high resolution, high contrast and high sensitivity to far ultraviolet rays (wavelength: 250–300 nm) and excimer laser (wavelength: 248, 308 nm), and it is also suitable for exposure to middle ultraviolet rays (wavelength: 300–350 nm).

Such a composition is useful particularly as a resist for fine working in the field for the production o semiconductor elements.

As described in the foregoing, the photoresist composition of the present invention has high transparency within the wavelength regions of far ultraviolet rays and excimer laser. Therefore, the sensitivity, resolution and contrast can remarkably be improved even when such active radiation required for a high resolution for lithography is used as the light source. Yet, it can be developed with an aqueous alkaline solution without swelling, whereby a fine photoresist pattern can be formed with high precision. Accordingly, such a composition is useful as a resist for the preparation of integrated circuits such as LSI and VLSI, for which the requirements for sensitivity and resolution will be increasely severe. Further, it can be widely used in the field for the production of semiconductor elements.

Now, the present invention will be described in further detail with reference to Examples. However, it should be understood that the present invention is by no means restricted by such specific Examples.

PREPARATION EXAMPLE 1

Preparation of a bicyclo[2,2,1]hepta-2,5-diene/maleic anhydride copolymer 9.8 g of maleic anhydride and 250 ml of dry xylene as a solvent are mixed and thoroughly stirred under a nitrogen stream at 50° C. until the system became uniform. Then, to this solution, 9.2 g of bicyclo[2,2,1]hepta-2,5-diene was added, and 0.48 g of benzoyl peroxide was added as a radical polymerization initiator thereto. The reaction was conducted under a nitrogen stream at 90° C. for 4 hours. Then, to this reaction mixture, a dry xylene solution containing 0.56 g of N-phenyl-2-naphthylamine was added, and the system was cooled to room temperature. The precipitated solid substance was collected by filtration and repeatedly purified by precipitation from ethyl ether after dissolving in tetrahydrofuran. Then, the product was vacuum-dried at 70° C. for 24 hours to obtain 11 g of colorless solid.

From the elemental analysis, the NMR analysis and the IR analysis, this colorless solid was confirmed to be the desired 1/1 alternating copolymer of bicyclo[2,2,1-]hepta-2,5-diene with maleic anhydride. The weight average molecular weight ($\overline{Mw}$) of this copolymer was 6,800 as measured by gel permeation chromatography (GPC) using polystyrene as the standard. Further, the ratio of the weight average molecular weight to the number average molecular weight ($\overline{MwMn}$) was 1.59.

Evaluation of the transparency of the resin

Then, the transparency of the above resin at 248 nm was evaluated. The evaluation was conducted in such a manner that the resin obtained was formed into a film having a thickness of 1.0 µm, and the transmittance of the film thus obtained for a monochromatic light having a wavelength of 248 nm was measured. Namely, 1.0 g of the above bicyclo[2,2,1]hepta-2,5-diene/maleic anhydride copolymer was dissolved in 4 ml of cyclohexanone to obtain a solution. This solution was spin-coated on a quartz glass substrate at 2,200 rpm by means of a spin coater and then heated (prebaked) at 90° C. for 20 minutes in a hot air circulating oven to form a coating film having a thickness of 1.0 µm. The light transmittance of the film thus obtained to a light of 248 nm was measured by means of a spectrophotometer. As a result, the above-mentioned bicyclo[2,2,1]hepta-2,5-diene/-maleic anhydride copolymer was found to have a transmittance of 82% T/µm.

PREPARATION EXAMPLE 2

Preparation of a 5-vinylbicyclo[2,2,1]hept-2-ene/maleic anhydride copolymer 9.8 g of maleic anhydride and 12.0 g of 5-vinylbicyclo[2,2,1]hept-2-ene were mixed, and 1.4 g of n-butyl mercaptan was added as a polymerization initiator thereto. Then, while blowing dry air into this mixture solution at a rate of 20 ml/min, the reaction was conducted at 90° C. for 4.5 hours. During this period, 10 ml of methyl isobutyl ketone was added every 1.5 hours for 3 times for the purpose of controlling the viscosity of the solution. Then, 1.4 g of n-butyl mercaptan was added anew, and the reaction was further continued for 9.5 hours. After completion of the reaction, volatile components were distilled off under reduced pressure, and the resulting solid product was repeatedly purified by precipitation from ethyl ether after dissolving in tetrahydrofuran. Then, the product was vacuum-dried at 70° C. for 24 hours to obtain 11 g of colorless solid.

From the elemental analysis, the NMR analysis and the IR analysis, this colorless solid was confirmed to be the desired 1/1 alternating copolymer of 5-vinylbicyclo[2,2,1]hept-2-ene with maleic anhydride. The weight average molecular weight (Mw) of this copolymer was 6,800 as measured by gel permeation chromatography (GPC) using polystyrene as the standard. The ratio of the weight average molecular weight to the number average molecular weight ($\overline{Mw/Mn}$) was 1.59.

Further, the transparency of this resin was evaluated in the same manner as in Preparation Example 1, whereby the resin was found to have a transmittance of 78% T/µm to a light having a wavelength of 248 nm.

PREPARATION EXAMPLES 3 to 9

Preparation of copolymers of other cycloolefins with maleic anhydride

Preparation Examples of copolymers of other cycloolefins with maleic anhydride, soluble in an aqueous alkaline solution, to be used for the photoresist compositions of the present invention, will be given in Table 1.

TABLE 1

| Prep. Example | Prep method | Resin No. | Aliphatic cyclic hydrocarbon | | Maleic anhydride (g) | Solvent | | Polymerization | |
|---|---|---|---|---|---|---|---|---|---|
| | | | Type | Amount (g) | | Type | Amount (ml) | Type | Amount (mg) |
| 3 | *1 | No. 3 | EBH | 12.0 | 9.8 | Xylene | 200 | BPO | 484 |
| 4 | " | No. 4 | MBH | 10.6 | " | " | 250 | " | " |

TABLE 1-continued

| | | Resin No. | | | | | | | |
|---|---|---|---|---|---|---|---|---|---|
| 5 | " | No. 5 | DCPD | 13.2 | " | Toluene | 100 | " | " |
| 6 | " | No. 6 | HDCPD | 13.4 | " | " | " | " | " |
| 7 | *2 | No. 7 | DMON | 16.0 | " | — | — | NBM | 1,400 |
| 8 | *1 | No. 8 | VCH | 10.8 | 19.6 | Xylene | 250 | BPO | 726 |
| 9 | " | No. 9 | COD | 10.8 | 9.8 | Benzene | " | AIBN | 328 |

| Prep. Example | Prep method | Resin No. | Reaction Time (hr) | Reaction temp (°C.) | Yield (g) | Mw[a] | Mw/Mn[b] | Trans-[c] parency (% T) |
|---|---|---|---|---|---|---|---|---|
| 3 | *1 | No. 3 | 4 | 90 | 15.8 | 7,200 | 1.48 | 81 |
| 4 | " | No. 4 | " | " | 9.3 | 4,800 | 1.72 | 80 |
| 5 | " | No. 5 | 24 | " | 6.2 | 4,700 | 2.03 | 82 |
| 6 | " | No. 6 | " | " | 5.6 | 3,600 | 1.98 | 81 |
| 7 | *2 | No. 7 | 14 | " | 13.2 | 6,700 | 1.55 | " |
| 8 | *1 | No. 8 | 16 | " | 5.8 | 5,600 | 1.76 | 71 |
| 9 | " | No. 9 | 4 | " | 12.3 | 8,700 | 1.45 | 83 |

*1: Same as in Prep. Example 1
*2: Same as in Prep. Example 2
EBH: 5-Ethylidenebicyclo[2,2,1]hept-2-ene
MBH: 5-Methylenebicyclo[2,2,1]hept-2-ene
DCPD: Dicyclopentadiene
HDCPD: 2,3-Dihydrodicyclopentadiene
DMON: 1,4,5,8-Dimethano-1,2,3,4,4a,5,8,8a-octahydronaphthalene
VCH: 4-Vinylcyclohexene
COD: Cycloocta-2,5-diene
BPO: Benzoyl peroxide
NBM: n-Butyl mercaptan
AIBN: Azobisisobutyronitrile
[a]Weight-average molecular weight as measured by GPC.
[b]Ratio of the weight-average molecular weight to the number-average molecular weight.
[c]Transmittance of a resin film having a thickness of 1 μm for a light having a wavelength of 248 nm.

PREPARATION EXAMPLE 10

Preparation of a bicyclo[2,2,1hepta-2,5-diene/maleimide copolymer 6.8 g of a bicyclo[2,2,1]hepta-2,5-diene/maleimide copolymer was prepared in the same manner as in Preparation Example 1 from 9.2 g of bicyclo[2,2,1]hepta-2,5-diene and 9.7 g of maleimide.

The weight average molecular weight ($\overline{Mw}$) of this copolymer was 7,100 as measured by gel permeation chromatography using polystyrene as the standard. The ratio of the weight average molecular weight to the number average molecular weight ($\overline{Mw}/\overline{Mn}$) was 1.63.

The transparency of this resin was evaluated in the same manner as in Preparation Example 1, whereby this resin was found to have a transmittance of 75% T/μm to a light having a wavelength of 248 nm.

PREPARATION EXAMPLE 11

Preparation of a 5-vinylbicyclo[2,2,1]hept-2-ene/maleic anhydride copolymer 6.8 g of a 5-vinylbicyclo[2,2,1]hept-2-ene/maleimide copolymer was prepared in the same manner as in Preparation Example 1 from 12.0 g of 5-vinylbicyclo[2,2,1]hept-2-ene and 9.7 g of maleimide.

The weight average molecular weight ($\overline{Mw}$) of this copolymer was 5,600 as measured by gel permeation chromatography (GPC) using polystyrene as the standard. The ratio of the weight average molecular weight to the number average molecular weight ($\overline{Mw}/\overline{Mn}$) was 1.78.

The transparency of this resin was evaluated in the same manner as in Preparation Example 1, whereby this resin was found to have a transmittance of 73% T/μm to a light having a wavelength of 248 nm.

PREPARATION EXAMPLES 12 to 18

Preparation of copolymers of other cycloolefins with maleimide

Preparation Examples of copolymers of other cycloolefins with maleimide, soluble in an aqueous alkaline solution, to be used for the photoresist compositions of the present invention, are shown in Table 2.

TABLE 2

| Prep. Example | Prep method | Resin No. | Aliphatic cyclic hydrocarbon | | Maleimide (g) | Solvent | | Polymerization | |
|---|---|---|---|---|---|---|---|---|---|
| | | | Type | Amount (g) | | Type | Amount (ml) | Type | Amount (mg) |
| 12 | *1 | No. 12 | EBH | 12.0 | 9.7 | Xylene | 200 | BPO | 484 |
| 13 | " | No. 13 | MBH | 10.6 | " | " | 250 | " | " |
| 14 | " | No. 14 | DCPD | 13.2 | " | Toluene | 100 | " | " |
| 15 | " | No. 15 | HDCPD | 13.4 | " | " | " | " | " |
| 16 | *2 | No. 16 | DMON | 16.0 | " | — | — | NBM | 1,400 |
| 17 | *1 | No. 17 | VCH | 10.8 | 19.4 | Xylene | 250 | BPO | 726 |
| 18 | " | No. 18 | COD | " | 9.7 | Benzene | " | AIBN | 328 |

| Prep. Example | Prep method | Resin No. | Reaction Time (hr) | Reaction temp (°C.) | Yield (g) | Mw[a] | Mw/Mn[b] | Trans-[c] parency (% T) |
|---|---|---|---|---|---|---|---|---|
| 12 | *1 | No. 12 | 4 | 90 | 14.3 | 5,800 | 1.63 | 78 |
| 13 | " | No. 13 | " | " | 10.2 | 4,200 | 1.85 | 75 |
| 14 | " | No. 14 | 24 | " | 4.3 | " | 1.98 | 78 |
| 15 | " | No. 15 | " | " | 5.2 | 2,800 | 2.44 | 79 |

TABLE 2-continued

| 16 | *2 | No. 16 | 14 | "  | 10.5 | 5,100 | 1.75 | 74 |
| 17 | *1 | No. 17 | 16 | "  | 5.6  | 4,800 | 1.86 | 68 |
| 18 | "  | No. 18 | 4  | "  | 14.1 | 5,300 | 1.43 | 77 |

*1: Same as in Prep. Example 1
*2: Same as in Prep. Example 2

PREPARATION EXAMPLE 19

Hydrolysis of a bicyclo[2,2,1]hepta-2,5-diene/maleic anhydride copolymer 5 9 of the bicyclo[2,2,1]hepta-2,5-diene/maleic anhydride copolymer obtained in Preparation Example 1 and 100 ml of a 5% NaOH aqueous solution were mixed and reacted at 70° C. for 12 hours. After completion of the reaction, the system was acidified with hydrochloric acid. The precipitated solid substance was collected by filtration and washed repeatedly with water. Then, the substance was vacuum-dried at 70° C. for 24 hours to obtain 4.2 g of colorless solid.

From the IR analysis, this colorless solid was confirmed to be a product wherein acid anhydride rings in the starting resin were almost completely hydrolyzed, since absorptions at 1,770 cm$^{-1}$ and 1,850 cm$^{-1}$ (absorptions attributable to C=O of an acid anhydride ring) of the bicyclo[2,2,1]hepta-2,5-diene/maleic anhydride copolymer as the starting material resin, were found to have disappeared.

Further, the transparency of this resin was evaluated in the same manner as in Preparation Example 1, whereby this resin was found to have a transmittance of 78% T/μm to a light having a wavelength of 248 nm.

PREPARATION EXAMPLES 20 to 27

Hydrolysis of copolymers of other cycloolefins with maleic anhydride

Preparation Examples for the hydrolysis of copolymers of other cycloolefins with maleic anhydride, soluble in an aqueous alkaline solution, to be used for the photoresist composition of the present invention, are shown in Table 3.

TABLE 3

| Prep. Example | Prep method | Resin No. | Resin used as starting material Resin No. | Resin used as starting material Amount (g) | Solvent Type | Solvent Amount (ml) | Reaction temp (°C.) | Reaction time (hr) | Yield (g) | Trans-[c] parency (% T) |
| --- | --- | --- | --- | --- | --- | --- | --- | --- | --- | --- |
| 20 | *3 | No. 20 | No. 2 | 5.0 | 5% NaOH aqueous solution | 100 | 70 | 12 | 4.8 | 89 |
| 21 | "  | No. 21 | No. 3 | "  | 5% NaOH aqueous solution | "  | "  | "  | 4.7 | 92 |
| 22 | "  | No. 22 | No. 4 | "  | 5% NaOH aqueous solution | "  | "  | "  | 4.8 | "  |
| 23 | "  | No. 23 | No. 5 | "  | 5% NaOH aqueous solution | "  | "  | "  | 4.5 | 90 |
| 24 | "  | No. 24 | No. 6 | "  | 5% NaOH aqueous solution | "  | "  | "  | 5.0 | 89 |
| 25 | "  | No. 25 | No. 7 | "  | 5% NaOH aqueous solution | "  | "  | "  | 4.7 | 88 |
| 26 | "  | No. 26 | No. 8 | "  | 5% NaOH aqueous solution | "  | "  | "  | "  | 81 |
| 27 | "  | No. 27 | No. 9 | "  | 5% NaOH aqueous solution | "  | "  | "  | 4.8 | 92 |

*3: Same as in Prep. Example 19

PREPARATION EXAMPLE 28

Esterification of a bicyclo[2,2,1hepta-2,5-diene/maleic anhydride copolymer 5g of the bicyclo[2,2,1]hepta-2,5-diene/maleic anhydride copolymer obtained in Preparation Example 1 and 150 ml of dry THF were mixed and thoroughly stirred at 40° C. until the system became uniform. Then, to this solution, 15.8 g of isopropyl alcohol was added, and 0.5 ml of concentrated sulfuric acid was added as a catalyst thereto. The mixture was refluxed for 8 hours under heating. After completion of the reaction, the reaction solution was poured into a large amount of water, and the precipitated solid substance was collected by filtration. The substance was repeatedly purified by precipitation from water after dissolving in tetrahydrofuran, and then vacuum-dried at 70° C. for 24 hours to obtain 5.1 g of colorless solid.

From the NMR analysis and the IR analysis, this colorless solid was confirmed to be a product obtained by esterification ring-opening of a part of acid anhydride rings in the bicyclo[2,2,1]hepta-2,5-diene/maleic anhydride copolymer as the starting material resin by isopropyl alcohol. The esterification rate of the acid anhydride rings of this resin was 68% as calculated from the changes in the absorptions at 1,770 cm$^{-1}$ and 1850 cm$^{-1}$ by the IR analysis.

Further, the transparency of this resin was evaluated in the same manner as in Preparation Example 1, whereby this resin was found to have a transmittance of 78% T/μm to a light having a wavelength of 248 nm.

PREPARATION EXAMPLES 29 to 34

Esterification of copolymers of other cycloolefins with maleic anhydride

Preparation Examples for esterification of copolymers of other cycloolefins with maleic anhydride, soluble in an aqueous alkaline solution, to be used for the photoresist compositions of the present invention, are shown in Table 4.

precipitation from ethyl ether after dissolving in tetrahydrofuran and then vacuum dried at 70° C. for 24 hours to obtain 5.1 g of colorless solid.

From the NMR analysis and the IR analysis, this colorless solid was found to be a product obtained by amido ring-opening of a part of acid anhydride rings in the bicyclo[2,2,1]hepta-2,5-diene/maleic anhydride copolymer as the starting material resin by isopropylamine. Further, the amido-conversion of the acid anhydride rings of this resin was 68% as calculated from the content of the nitrogen atom by the elemental analysis

TABLE 4

| Prep. Example | Prep method | Resin No. | Resin used as starting material | | Compound having a hydroxyl group | | Solvent | | Amount of sulfuric acid as catalyst (ml) |
|---|---|---|---|---|---|---|---|---|---|
| | | | Type | Amount (g) | Type | Amount (g) | Type | Amount (g) | |
| 29 | *4 | No. 29 | No. 2 | 5.0 | IPA | 13.8 | THF | 150 | 0.5 |
| 30 | " | No. 30 | No. 3 | " | CHA | 22.9 | " | " | " |
| 31 | " | No. 31 | No. 4 | " | TBA | 18.1 | " | " | " |
| 32 | " | No. 32 | No. 6 | " | EG | 9.9 | " | " | " |
| 33 | " | No. 33 | No. 7 | " | MG | 17.4 | " | " | " |
| 34 | " | No. 34 | No. 9 | " | PH | 21.8 | " | 200 | " |

| Prep. Example | Prep method | Resin No. | Reaction temp. (°C.) | Reaction time (hr) | Yield (g) | Ring-opening rate (%) | Trans-[c] parency (% T) |
|---|---|---|---|---|---|---|---|
| 29 | *4 | No. 29 | Reflux | 8 | 5.3 | 63 | 90 |
| 30 | " | No. 30 | " | " | 5.1 | 68 | 93 |
| 31 | " | No. 31 | " | " | 4.6 | 64 | 91 |
| 32 | " | No. 32 | " | " | 3.7 | 55 | 83 |
| 33 | " | No. 33 | " | " | 5.8 | 68 | 85 |
| 34 | " | No. 34 | " | " | 5.5 | 38 | 56 |

*4: Same as in Prep. Example 28
IPA: Isopropyl alcohol
CHA: Cyclohexyl alcohol
TBA: Tert-butyl alcohol
EG: Ethylene glycol
MG: Methyl glycolate
PH: Phenol
THF: Tetrahydrofuran

PREPARATION EXAMPLE 35

Amido-conversion of a bicyclo[2,2,1]hepta-2,5-diene/maleic anhydride copolymer 5 g of the bicyclo.:2,2,1]hepta-2,5-diene/maleic anhydride copolymer obtained in Preparation Example 1 and 100 ml of dry dimethylformamide were mixed and thoroughly stirred at 50° C. until the system became uniform. Then to this solution, 15.0 g of isopropylamine was added, and the reaction was conducted at 80° C. for 8 hours. After completion of the reaction, the reaction solution was poured into a large amount of ethyl ether, and the precipitated solid substance was collected by filtration. The substance was repeatedly purified by of this resin.

Further, the transparency of this resin was evaluated in the same manner as in Preparation Example 1, whereby this resin was found to have a transmittance of 78% T/μm to a light having a wavelength of 248 nm.

PREPARATION EXAMPLES 36 to 41

Amido-conversion of copolymers of other cycloolefins with maleic anhydride

Preparation Examples for amido-conversion of the copolymers of other cycloolefins with maleic anhydride, soluble in an aqueous alkaline solution, to be used for the photoresist compositions of the present invention, are shown in Table 5.

TABLE 5

| Prep. Example | Prep method | Resin No. | Resin used as starting material | | Compound having an amino group | | Solvent | | Reaction temp. (°C.) | Reaction time (hr) | Yield (g) | Ring-opening rate (%) | Trans-[c] parency (% T) |
|---|---|---|---|---|---|---|---|---|---|---|---|---|---|
| | | | Type | Amount (g) | Type | Amount (g) | Type | Amount (ml) | | | | | |
| 36 | *5 | No. 36 | No. 2 | 5.0 | IPAM | 5.0 | DMF | 100 | 80 | 8 | 4.3 | 68 | 88 |
| 37 | " | No. 37 | No. 3 | " | CHAM | 7.6 | " | " | " | " | 4.4 | 72 | 90 |
| 38 | " | No. 38 | No. 4 | " | TBAM | 6.0 | " | " | " | " | 4.7 | 63 | 89 |
| 39 | " | No. 39 | No. 6 | " | ETAM | 4.4 | " | " | " | " | 3.8 | 80 | 80 |
| 40 | " | No. 40 | No. 7 | " | ABA | 6.7 | " | " | " | " | 4.6 | 51 | 81 |

TABLE 5-continued

| Prep. Example | Prep method | Resin No. | Resin used as starting material Type | Amount (g) | Compound having an amino group Type | Amount (g) | Solvent Type | Amount (ml) | Reaction temp. (°C.) | Reaction time (hr) | Yield (g) | Ring-opening rate (%) | Trans-[c] parency (% T) |
|---|---|---|---|---|---|---|---|---|---|---|---|---|---|
| 41 | " | No. 41 | No. 9 | " | OAPH | 8.8 | " | " | " | " | 5.1 | 86 | 46 |

*4: Same as in Prep. Example 35
IPAM: Isopropylamine
CHAM: Cyclohexylamine
TBAM: Tert-butylamine
TEAM: Ethanolamine
ABA: 4-Aminobutyric acid
OAPH: o-Aminophenol
DMF: N,N-dimethylformamide

PREPARATION EXAMPLE 42

Imido ring-closure of the amido-conversion product of a bicyclo[2,2,1]hepta-2,5-diene/maleic anhydride copolymer 5 g of the amido-conversion product of the bicyclo[2,2,1]hepta-2,5-diene/maleic anhydride copolymer obtained in Preparation Example 35 and 100 ml of dry dimethylformamide were mixed and thoroughly stirred at 50° C. until the system became uniform. Then, to this solution, 3.5 g of tri-n-butylamine as a catalyst and 12 ml of toluene as an azeotropic solvent were added, and the mixture was heated at 140° C. Water formed was azeotropically gradually removed from the reaction system, and the reaction was conducted for 4 hours until water no longer formed. After completion of the reaction, the reaction solution was poured into a large amount of ethyl ether, and the precipitated solid substance was collected by filtration. The substance was repeatedly purified by precipitation from ethyl ether after dissolving in tetrahydrofuran and then vacuum-dried at 70° C. for 24 hours to obtain 5.1 g of colorless solid.

From the IR analysis, this colorless solid was confirmed to be a product obtained by imido ring-closure of the amido ring-opened moiety of the acid anhydride rings in the amido conversion product of the bicyclo[2,2,1]hepta-2,5-diene/maleic anhydride copolymer as the starting material resin, since the absorption at 1,720 cm$^{-1}$ (absorption attributable to C=O of a carboxyl group) of the amido-conversion product of the bicyclo[2,2,1]hepta-2,5-diene/maleic anhydride copolymer as the starting material resin, was found to have disappeared in this colorless solid.

Further, the transparency of this resin was evaluated in the same manner as in Preparation Example 1, whereby this resin was found to have a transmittance of 78% T/μm to a light having a wavelength of 248 nm.

PREPARATION EXAMPLES 43 to 47

Imido ring-closure of the amido conversion products of the copolymers of other cycloolefins with maleic anhydride Preparation Examples for imido ring-closure of the amido conversion products of the copolymers of other cycloolefins with maleic anhydride, soluble in an aqueous alkaline solution, to be used for the photoresist compositions of the present invention, are shown in Table 6.

TABLE 6

| Prep. Example | Prep method | Resin No. | Resin used as starting material Type | Ring-opening rate | Amount (ml) | Solvent Type | Amount (g) | Tri-n-butylamine as catalyst (g) | Reaction temp. (°C.) | Reaction time (hr) | Yield (g) | Ring-closing rate (%) | Trans-[c] parency (% T) |
|---|---|---|---|---|---|---|---|---|---|---|---|---|---|
| 43 | *6 | No. 43 | No. 36 | 68 | 5.0 | DHF toluene | 100 12 | 3.5 | 140 | 4 | 3.8 | 100 | 78 |
| 44 | " | No. 44 | No. 37 | 72 | " | DHF toluene | 100 12 | " | " | " | 3.6 | " | 79 |
| 45 | " | No. 45 | No. 38 | 63 | " | DHF toluene | 100 12 | " | " | " | 4.1 | " | 71 |
| 46 | " | No. 46 | No. 39 | 80 | " | DHF toluene | 100 12 | " | " | 6 | 3.8 | " | 75 |
| 47 | " | No. 47 | No. 41 | 86 | " | DHF toluene | 100 12 | " | " | 4 | 4.2 | " | 48 |

*4: Same as in Prep. Example 42

EXAMPLE 1

Formation of a positive image Preparation of a quinone diazide type positive photoresist composition A positive photoresist composition of the present invention comprising 8.0 g of the resin obtained in Preparation Example 1 and 1.3 g of 2,3,4-trihydroxybenzophenone-2,3,4 -tris[naphthoquinone-1,2-diazido-5-sulfonate] was dissolved in 22 ml of cyclohexanone. This solution was filtered through a 0.2 μm filter to obtain a resist solution.

Coating of a photoresist

The above resist solution was spin-coated at 2,300 rpm by a spin coater on a silicon wafer treated by hydrophobic treatment with HMDS (hexamethyl disilazane). Then, this wafer was heated (prebaked) at 90° C. for 20 minutes in a hot air circulating oven to form a resist film having a thickness of 1.0 μm.

Measurement of the sensitivity of the resist

To the above resist film, a KrF excimer laser (wavelength: 248 nm) was irradiated by changing the position and the dose of exposure. After the irradiation, the resist film was immersed in an aqueous solution containing 1.0% of tetramethylammonium hydroxide for development. Then, the resist film was rinsed with deionized water for 40 seconds and heated (post baked) at 90° C. for 30 minutes in a hot air circulating oven. The thickness of the film thus obtained was measured by means of a contact type film thickness meter. The relation between the exposed dose and the film remaining rate was plotted, and the exposed dose at which the film remaining rate became 0%, was taken as the sensitivity. As a result, the sensitivity of the above resist was 74 mj/cm$^2$.

Formation of a fine image

The non exposed resist film obtained in the same manner, was subjected to exposure to a KrF excimer laser at a proper dose by means of a 5:1 reduced projection exposure apparatus with a KrF excimer laser as the light source by using a chromium photomask having a fine pattern. After the exposure, this resist film was immersed in an aqueous solution containing 1.0% of tetramethylammonium hydroxide for one minute for development. Then, it was rinsed with deionized water for 40 seconds and heated (post baked) at 90° C. for 30 minutes in a hot air circulating oven to obtain a positive image of the photomask pattern.

The positive image thus obtained was inspected by a scanning type electron microscope, whereby it was found that an image having an excellent rectangular pattern profile with 0.5 μmL/S (line and space) was formed.

EXAMPLE 2

Formation of a negative image

Preparation of a bisazide type negative photoresist composition

A negative photoresist composition of the present invention comprising 8.0 g of the resin obtained in Preparation Example 1 and 1.1 g of 3,3'-diazidodiphenylsulfone as a photosensitive agent, was dissolved in 22 ml of cyclohexanone. This solution was filtered through a 0.2 μm filter to obtain a resist solution.

Coating of a photoresist

The above resist solution was spin coated in the same manner as in Example 1 on a silicon wafer treated by hydrophobic treatment with HMDS (hexamethyldisilazane) to form a resist film having a thickness of 1.0 μm.

Measurement of the sensitivity of the resist

To the above resist film, a KrF excimer laser (wavelength: 248 nm) was irradiated by changing the position and dose of exposure. After the irradiation, this resist film was immersed in an aqueous solution containing 1.0% of tetramethylammonium hydroxide for one minute for development. Then, it was rinsed with deionized water for 40 seconds and heated (post baked) at 90° C. for 30 minutes in a hot air circulating oven. The thickness of the film thus obtained was measured by a contact type film thickness meter. The relation between the exposed dose and the film remaining rate was plotted, and the exposed dose at which the film remaining rate became 80%, was taken as the sensitivity. As a result, the sensitivity of the above resist was 128 mj/cm$^2$.

Formation of a fine image

The non-exposed resist film obtained in the same manner, was subjected to exposure to a KrF excimer laser at a proper dose by means of a 5:1 reduced projection exposure apparatus with a KrF excimer laser as the light source by using a chromium photomask having a fine pattern. After the exposure, this resist film was immersed in an aqueous solution containing 1.0% of tetramethylammonium hydroxide for one minute for development. Then, it was rinsed with deionized water for 40 seconds and heated (post baked) at 90° C. for 30 minutes in a hot air circulating oven to obtain a negative image of the photomask pattern.

The negative image thus obtained was inspected by a scanning type electron microscope, whereby it was found that an image having an excellent rectangular pattern profile with 0 5 μmL/S (line and space) was formed.

EXAMPLES 3 TO 94

By using other photoresist compositions of the present invention prepared in a similar manner, positive or negative images were formed in the same manner as in Example 1 or Example 2. The results are shown in Table 7.

TABLE 7

| Example No. | Resin No. | Photo-sensitive agent | Weight ratio of resin to photosensitive agent | Coating solvent | Type of image | Film[d] thickness (μm) | Sensi-[e] tivity (mj/cm$^2$) | Development[f] Consentration of the developing solution (%) | Development[f] Time for development (sec) | Resolu-[g] tion (μm) |
|---|---|---|---|---|---|---|---|---|---|---|
| 3 | No. 2 | A | 6/1 | CH | Positive | 1.0 | 83 | 1.0 | 90 | 0.5 |
| 4 | " | B | 7/1 | " | Negative | " | 85 | " | 120 | 0.6 |
| 5 | No. 3 | A | 6/1 | " | Positive | " | 92 | " | 60 | " |
| 6 | " | B | 7/1 | " | Negative | " | 123 | " | 90 | 0.7 |
| 7 | No. 4 | A | 6/1 | " | Positive | " | 85 | " | 60 | 0.6 |
| 8 | " | B | 7/1 | " | Negative | " | 108 | " | 80 | " |
| 9 | No. 5 | A | 6/1 | " | Positive | " | 80 | " | 60 | 0.7 |
| 10 | " | B | 7/1 | " | Negative | " | 103 | " | " | " |
| 11 | No. 6 | A | 6/1 | " | Positive | " | 110 | " | 40 | 0.5 |
| 12 | " | B | 7/1 | " | Negative | " | 155 | " | 50 | " |
| 13 | No. 7 | A | 6/1 | CH | Positive | 1.0 | 88 | 0.1 | 60 | 0.6 |
| 14 | " | B | 7/1 | " | Negative | " | 115 | " | 80 | 0.7 |
| 15 | No. 8 | A | 6/1 | " | Positive | " | 91 | 0.6 | 70 | " |
| 16 | " | B | 7/1 | " | Negative | " | 140 | " | 80 | " |

TABLE 7-continued

| Example No. | Resin No. | Photo-sensitive agent | Weight ratio of resin to photosensitive agent | Coating solvent | Type of image | Film thickness (μm) | Sensitivity (mj/cm²) | Concentration of the developing solution (%) | Time for development (sec) | Resolution (μm) |
|---|---|---|---|---|---|---|---|---|---|---|
| 17 | No. 9 | A | 6/1 | " | Positive | " | 85 | 1.0 | 60 | 0.5 |
| 18 | " | B | 7/1 | " | Negative | " | 113 | " | 80 | 0.6 |
| 19 | No. 10 | A | 6/1 | " | Positive | " | 85 | " | 60 | 0.7 |
| 20 | " | B | 7/1 | " | Negative | " | 155 | " | 65 | 0.9 |
| 21 | No. 11 | A | 6/1 | " | Positive | " | 92 | " | 60 | 0.8 |
| 22 | " | B | 7/1 | " | Negative | " | 170 | " | 70 | 1.0 |
| 23 | No. 12 | A | 6/1 | " | Positive | " | 105 | " | 60 | 0.8 |
| 24 | " | B | 7/1 | " | Negative | " | 148 | " | 80 | 1.0 |
| 25 | No. 13 | A | 6/1 | " | Positive | " | 83 | " | 50 | 0.8 |
| 26 | " | B | 7/1 | " | Negative | " | 163 | " | 60 | 0.9 |
| 27 | No. 14 | A | 6/1 | " | Positive | " | 90 | " | 65 | 0.8 |
| 28 | " | B | 7/1 | " | Negative | " | 158 | " | 70 | " |
| 29 | No. 15 | A | 6/1 | " | Positive | " | 110 | " | 55 | 0.7 |
| 30 | " | B | 7/1 | " | Negative | " | 173 | " | 90 | 0.8 |
| 31 | No. 16 | A | 6/1 | CH | Positive | 1.0 | 105 | 1.0 | 65 | 0.6 |
| 32 | " | B | 7/1 | " | Negative | " | 168 | " | 75 | 0.9 |
| 33 | No. 17 | A | 6/1 | " | Positive | " | 93 | " | 70 | 0.8 |
| 34 | " | B | 7/1 | " | Negative | " | 163 | " | " | " |
| 35 | No. 18 | A | 6/1 | " | Positive | " | 95 | 0.6 | 40 | 0.9 |
| 36 | " | B | 7/1 | " | Negative | " | 210 | " | 50 | 1.0 |
| 37 | No. 19 | A | 4/1 | DMF | Positive | " | 91 | 0.1 | 70 | 0.8 |
| 38 | " | B | 6/1 | " | Negative | " | 155 | " | 100 | 0.9 |
| 39 | No. 20 | A | 4/1 | " | Positive | " | 105 | " | 90 | 0.7 |
| 40 | " | B | 6/1 | " | Negative | " | 123 | " | 110 | 1.0 |
| 41 | No. 21 | A | 4/1 | " | Positive | " | 103 | " | 90 | 0.8 |
| 42 | " | B | 6/1 | " | Negative | " | 210 | " | 120 | 0.9 |
| 43 | No. 22 | A | 4/1 | " | Positive | " | 98 | " | 110 | 0.8 |
| 44 | " | B | 6/1 | " | Negative | " | 185 | " | 140 | 1.0 |
| 45 | No. 23 | A | 4/1 | " | Positive | " | 114 | " | 80 | 0.9 |
| 46 | " | B | 6/1 | " | Negative | " | 220 | " | 105 | 1.0 |
| 47 | No. 24 | A | 4/1 | " | Positive | " | 111 | " | 90 | 0.8 |
| 48 | " | B | 6/1 | " | Negative | " | 198 | " | 110 | " |
| 49 | No. 25 | A | 4/1 | DMF | Positive | 1.0 | 103 | 0.1 | 90 | 0.9 |
| 50 | " | B | 6/1 | " | Negative | " | 173 | " | 105 | 1.0 |
| 51 | No. 26 | A | 4/1 | " | Positive | " | 105 | " | 40 | " |
| 52 | " | B | 6/1 | " | Negative | " | 185 | " | 50 | 1.2 |
| 53 | No. 27 | A | 4/1 | " | Positive | " | 89 | " | 100 | 0.7 |
| 54 | " | B | 4/1 | " | Negative | " | 165 | " | 120 | 0.8 |
| 55 | No. 28 | C | 5/1 | ECA | Positive | " | 120 | 1.5 | 90 | 0.5 |
| 56 | " | D | " | " | Negative | " | 130 | " | 60 | " |
| 57 | No. 29 | C | " | " | Positive | " | 131 | " | 90 | " |
| 58 | " | D | " | " | Negative | " | 143 | " | 60 | 0.6 |
| 59 | No. 30 | C | " | " | Positive | " | 128 | " | 100 | 0.5 |
| 60 | " | D | " | " | Negative | " | 151 | " | 65 | 0.6 |
| 61 | No. 31 | C | " | " | Positive | " | 96 | " | 80 | " |
| 62 | " | D | " | " | Negative | " | 144 | " | 60 | " |
| 63 | No. 32 | C | " | " | Positive | " | 115 | " | 90 | " |
| 64 | " | D | " | " | Negative | " | 138 | " | 65 | 0.7 |
| 65 | No. 33 | C | " | " | Positive | " | 121 | " | 90 | 0.5 |
| 66 | " | D | " | " | Negative | " | 153 | " | 60 | 0.6 |
| 67 | No. 34 | C | 5/1 | ECA | Positive | 1.0 | 105 | 1.5 | 60 | 0.6 |
| 68 | " | D | " | " | Negative | " | 113 | " | 85 | 0.7 |
| 69 | No. 35 | C | " | " | Positive | " | 98 | " | 70 | 0.6 |
| 70 | " | D | " | " | Negative | " | 148 | " | 100 | " |
| 71 | No. 36 | C | " | " | Positive | " | 120 | " | 75 | 0.5 |
| 72 | " | D | " | " | Negative | " | 152 | " | 100 | 0.6 |
| 73 | No. 37 | C | " | " | Positive | " | 113 | " | 85 | 0.5 |
| 74 | " | D | " | " | Negative | " | 152 | " | 90 | 0.8 |
| 75 | No. 38 | C | " | " | Positive | " | 118 | " | 60 | 0.5 |
| 76 | " | D | " | " | Negative | " | 135 | " | 110 | 0.9 |
| 77 | No. 39 | C | " | " | Positive | " | 103 | " | 80 | 0.7 |
| 78 | " | D | " | " | Negative | " | 163 | " | 85 | 0.8 |
| 79 | No. 40 | C | " | " | Positive | " | 115 | " | " | 0.6 |
| 80 | " | D | " | " | Negative | " | 148 | " | 65 | 0.7 |
| 81 | No. 41 | C | " | " | Positive | " | 115 | " | 60 | 0.6 |
| 82 | " | D | " | " | Negative | " | 167 | " | 80 | " |
| 83 | No. 42 | E | 4/1 | CH | Positive | " | 85 | 2.5 | 90 | 0.5 |
| 84 | " | F | 5/1 | " | Negative | " | 115 | " | 120 | 0.6 |
| 85 | No. 43 | E | 4/1 | CH | Positive | 1.0 | 78 | 2.5 | 90 | 0.5 |
| 86 | " | F | 5/1 | " | Negative | " | 138 | " | 110 | 0.6 |
| 87 | No. 44 | E | 4/1 | " | Positive | " | 80 | " | 95 | 0.5 |
| 88 | " | F | 5/1 | " | Negative | " | 136 | " | 110 | " |
| 89 | No. 45 | E | 4/1 | " | Positive | " | 85 | " | 90 | 0.6 |
| 90 | " | F | 5/1 | " | Negative | " | 123 | " | 100 | " |
| 91 | No. 46 | E | 4/1 | " | Positive | " | 83 | " | 85 | " |
| 92 | " | F | 5/1 | " | Negative | " | 119 | " | 110 | 0.7 |

TABLE 7-continued

| Example No. | Resin No. | Photo-sensitive agent | Weight ratio of resin to photosensitive agent | Coating solvent | Type of image | Film[d] thickness (μm) | Sensi-[e] tivity (mj/cm²) | Development[f] Consentration of the developing solution (%) | Time for development (sec) | Resolu-[g] tion (μm) |
|---|---|---|---|---|---|---|---|---|---|---|
| 93 | No. 47 | E | 4/1 | " | Positive | " | 79 | " | 95 | " |
| 94 | " | F | 5/1 | " | Negative | " | 135 | " | 120 | " |

A: 2,3,4-Trihydroxybenzophenone-2,3,4-tris[naphthoquinone-1,2-diazido-5-sulfonate]
B: 4,4'-diazidodiphenylsulfone
C: 1,1,1-Tris-(4-diazo-3,5-dioxocyclohexane-1-carbonyloxymethyl)propane
D: 4,4'-Diazidodiphenylsulfide
E: 1,1'-(Dodecamethylene)bis(3-diazo-2,4-piperidinedione)
F: 3,3'-Dimethoxy-4,4'-diazidobiphenyl
CH: Cyclohexanone
DMF: N,N-Dimethylformamide
ECA: Ethyl cellosolve acetate
[d]Initial film thickness
[e]The sensitivity was represented by the exposed dose at which the film remaining rate was 0% in the case of a positive resist, and 80% in the case of a negative resist.
[f]An aqueous solution of TMAH (tetramethylammonium hydroxide) was used as the developing solution, and the development was conducted by an immersion method.
[g]The resolution was represented by the width of the line of the L/S (line & space) pattern excellently resolved.

We claim:

1. A photoresist composition for far ultraviolet or excimer laser lithography, which comprises in admixture:
   a non-aromatic resin having no aromatic structure, soluble in an aqueous alkaline solution, having units of an aliphatic cyclic hydrocarbon main frame and units derived from maleic anhydride and/or units derived from a maleimide; and
   a photosensitive agent selected from the group consisting of a naphthoquinone diazide type positive photosensitive agent, a bis-azide type negative photosensitive agent and a diazo type positive photosensitive agent in a sufficient amount to promote or hinder the solubility of said resin in an aqueous alkaline solution upon exposure to active radiation so as to create a substantial difference in the solubility as between an exposed portion and a non-exposed portion and to form a positive or negative image by subsequent development with an aqueous alkaline solution.

2. The photoresist composition according to claim 1, wherein said resin soluble in an aqueous alkaline solution is a copolymer of an aliphatic cyclic hydrocarbon having at least one unsaturated double bond, with maleic anhydride.

3. The photoresist composition according to claim 1, wherein said resin soluble in an aqueous alkaline solution is a copolymer of an aliphatic cyclic hydrocarbon having at least one unsaturated double bond, with a maleimide.

4. The photoresist composition according to claim 1, wherein said resin soluble in an aqueous alkaline solution is a resin obtained by hydrolyzing acid anhydride rings in maleic anhydride units of a copolymer of an aliphatic cyclic hydrocarbon having at least one unsaturated double bond, with maleic anhydride.

5. The photoresist composition according to claim 1, wherein said resin soluble in an aqueous alkaline solution is a resin obtained by ring-opening acid anhydride rings in maleic anhydride units of a copolymer of an aliphatic cyclic hydrocarbon having at least one unsaturated double bond, with maleic anhydride, by a compound having a hydroxyl group.

6. The photoresist composition according to claim 1, wherein said resin soluble in an aqueous alkaline solution is a resin obtained by ring-opening an acid anhydride rings in maleic anhydride units of a copolymer of an aliphatic cyclic hydrocarbon having at least one unsaturated double bond, with maleic anhydride, by a compound having an amino group.

7. The photoresist composition according to claim 1, wherein said resin soluble in an aqueous alkaline solution is a resin obtained by ring-opening acid anhydride rings in maleic anhydride units of a copolymer of an aliphatic cyclic hydrocarbon having at least one unsaturated double bond, with maleic anhydride, by a compound having an amino group, followed by imido-ring closure of a part or whole of maleic acid units formed by the ring-opening in the copolymer.

8. The photoresist composition according to any one of claims 2 to 7, wherein said aliphatic cyclic hydrocarbon is a compound of the formula (1):

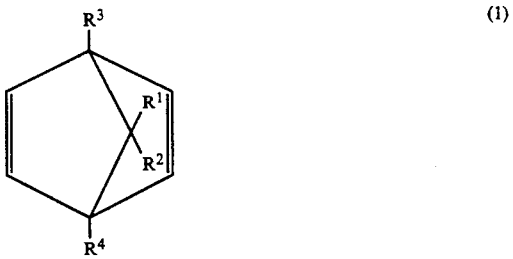

(1)

wherein each of $R^1$ to $R^4$ which may be the same or different, is a hydrogen atom or an alkyl group having from 1 to 3 carbon atoms.

9. The photoresist composition according to any one of claims 2 to 7, wherein said aliphatic cyclic hydrocanbon is a compound of the formula (2):

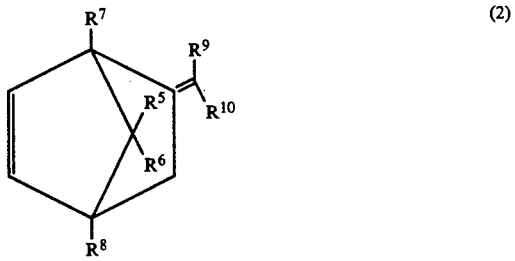

(2)

wherein each of $R^5$ to $R^{10}$ which may be the same or different, is a hydrogen atom or an alkyl group having from 1 to 3 carbon atoms.

10. The photoresist composition according to any one of claims 2 to 7, wherein said aliphatic cyclic hydrocarbon is a compound of the formula (3):

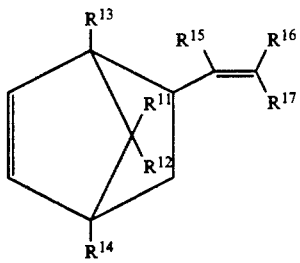
(3)

wherein each of $R^{11}$ to $R^{17}$ which may be the same or different, is a hydrogen atom or an alkyl group having from 1 to 3 carbon atoms.

11. The photoresist composition according to any one of claims 2 to 7, wherein said aliphatic cyclic hydrocarbon is a compound of the formula (4):

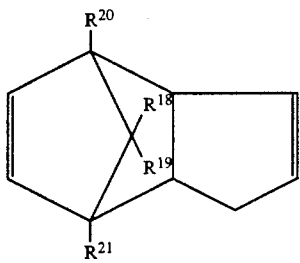
(4)

wherein each of $R^{18}$ to $R^{21}$ which may be the same or different, is a hydrogen atom or an alkyl group having from 1 to 3 carbon atoms.

12. The photoresist composition according to any one of claims 2 to 7, wherein said aliphatic cyclic hydrocarbon is a compound of the formula (5):

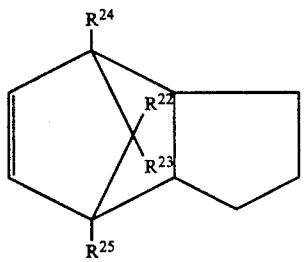
(5)

wherein each of $R^{22}$ to $R^{25}$ is a hydrogen atom or an alkyl group having from 1 to 3 carbon atoms.

13. The photoresist composition according to any one of claims 2 to 7, wherein said aliphatic cyclic hydrocarbon is a compound of the formula (6):

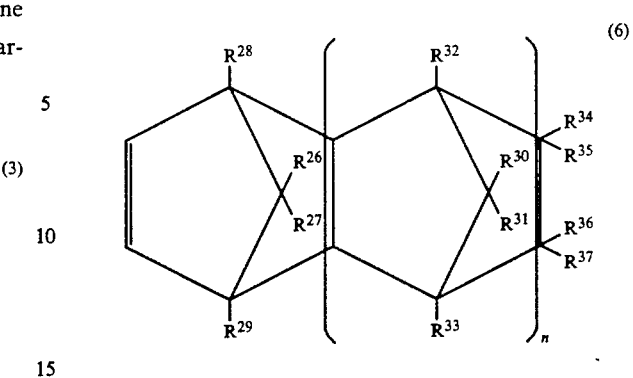
(6)

wherein each of $R^{26}$ to $R^{37}$ which may be the same or different, is a hydrogen atom or an alkyl group having from 1 to 3 carbon atoms, provided that $R^{34}$ or $R^{35}$ may, together with $R^{36}$ or $R^{37}$, form a ring, n is an integer of 0 or at least 1, and when $R^{30}$ to $R^{33}$ are repeated, they may be the same or different.

14. The photoresist composition according to any one of claims 2 to 7, wherein said aliphatic cyclic hydrocarbon is a compound of the formula (7):

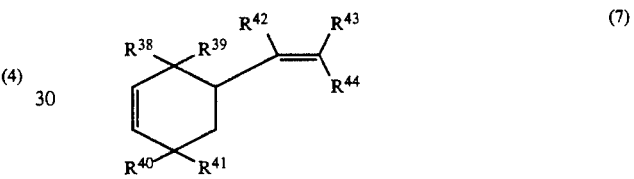
(7)

wherein each of $R^{38}$ to $R^{44}$ which may be the same or different, is a hydrogen atom or an alkyl group having from 1 to 3 carbon atoms.

15. The photoresist composition according to any one of claims 2 to 7, wherein said aliphatic cyclic hydrocarbon is a compound of the formula (8):

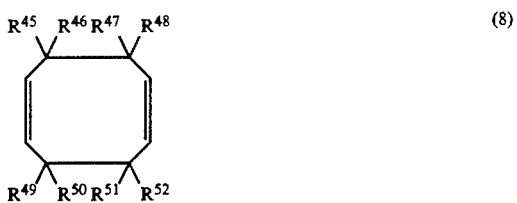
(8)

wherein each of $R^{45}$ to $R^{52}$ which may be the same or different, is a hydrogen atom or an alkyl group having from 1 to 3 carbon atoms.

16. The photoresist composition according to claim 5, wherein said compound having a hydroxyl group is a compound of the formula (9):

$$HO-R^{53} \quad (9)$$

wherein $R^{53}$ is an alkyl group, a cycloalkyl group or a group of the formula (10), (11) or (12):

$$-R^{54}-OH \quad (10)$$

(11)

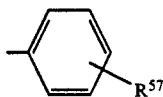 (12)

wherein each of $R^{54}$ and $R^{55}$ is an alkylene group, $R^{56}$ is a hydrogen atom, an alkyl group or a cycloalkyl group, and $R^{57}$ is a hydrogen atom, an alkyl group, a carboxyl group, an alkoxy group, a nitro group or an amino group.

17. The photoresist composition according to claim 6 or 7, wherein said compound having an amino group is a compound of the formula (13):

$$H_2N-R^{58} \quad (13)$$

wherein $R^{58}$ is an alkyl group, a cycloalkyl group or a group of the formula (14), (15) or (16):

$$-R^{59}-OH \quad (14)$$

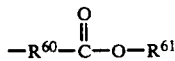 (15)

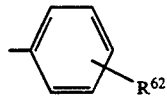 (16)

each of $R^{59}$ and $R^{60}$ is an alkylene group, $R^{61}$ is a hydrogen atom, an alkyl group or a cycloalkyl group, and $R^{62}$ is a hydrogen atom, an alkyl group, a carboxyl group, an alkoxy group, a nitro group or an amino group.

18. The photoresist composition according to any one of claims 1 to 7, wherein said photoresistive agent is in an amount of from 1 to 100 parts by weight per 100 parts by weight of said resin soluble in an aqueous alkaline solution.

19. The photoresist composition according to any one of claims 1 to 7, wherein said resin soluble in an aqueous alkaline solution has a molecular weight of from 1,000 to 20,000.

* * * * *

UNITED STATES PATENT AND TRADEMARK OFFICE
CERTIFICATE OF CORRECTION

PATENT NO. : 5,212,043
DATED : May 18, 1993
INVENTOR(S) : Takashi Yamamoto et al.

It is certified that error appears in the above-indentified patent and that said Letters Patent is hereby corrected as shown below:

On the title page, item [73], the assignee's information is incorrect, should read --Tosoh Corporation, Shin-nanyo, Japan--

Signed and Sealed this

Nineteenth Day of April, 1994

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,212,043
DATED : May 18, 1993
INVENTOR(S) : Takashi Yamamoto, et al It is certified that error appears in the above-indentified patent and that said Letters Patent is hereby corrected as shown below:

On the title page, Item [86]
The PCT Information has been omitted, should read:
--PCT Pub. No.: WO89/07786

PCT Pub. Date: August 24, 1989--

Signed and Sealed this

Fourteenth Day of June, 1994

*Attest:*

BRUCE LEHMAN

*Attesting Officer*  *Commissioner of Patents and Trademarks*